(12) United States Patent
Shinriki et al.

(10) Patent No.: US 7,655,564 B2
(45) Date of Patent: Feb. 2, 2010

(54) METHOD FOR FORMING TA-RU LINER LAYER FOR CU WIRING

(75) Inventors: Hiroshi Shinriki, Tama (JP); Daekyun Jeong, Tama (JP)

(73) Assignee: ASM Japan, K.K., Tokyo (JP)

( * ) Notice: Subject to any disclaimer, the term of this patent is extended or adjusted under 35 U.S.C. 154(b) by 59 days.

(21) Appl. No.: 11/955,275

(22) Filed: Dec. 12, 2007

(65) Prior Publication Data

US 2009/0155997 A1   Jun. 18, 2009

(51) Int. Cl.
*H01L 21/44* (2006.01)

(52) U.S. Cl. ............... 438/653; 438/681; 257/E21.16; 257/E21.171

(58) Field of Classification Search .............. 438/653, 438/681, 677, 686; 427/255.23; 257/E21.16, 257/E21.161, E21.17, E21.171
See application file for complete search history.

(56) References Cited

U.S. PATENT DOCUMENTS

| | | | |
|---|---|---|---|
| 4,058,430 A | 11/1977 | Suntola et al. |
| 4,477,296 A | 10/1984 | Nair |
| 4,670,110 A | 6/1987 | Withers et al. |
| 4,860,687 A | 8/1989 | Frijlink |
| 4,902,551 A | 2/1990 | Nakaso et al. |
| 4,965,656 A | 10/1990 | Koubuchi et al. |
| 5,106,454 A | 4/1992 | Allardyce et al. |
| 5,382,333 A | 1/1995 | Ando et al. |
| 5,391,517 A | 2/1995 | Gelatos et al. |
| 5,453,494 A | 9/1995 | Kirlin et al. |
| 5,637,533 A | 6/1997 | Choi |
| 5,695,810 A | 12/1997 | Dubin et al. |
| 5,711,811 A | 1/1998 | Suntola et al. |
| 5,731,634 A | 3/1998 | Matsuo et al. |
| 5,820,664 A | 10/1998 | Gardiner et al. |
| 5,865,365 A | 2/1999 | Nishikawa et al. |
| 5,884,009 A | 3/1999 | Okase |

(Continued)

FOREIGN PATENT DOCUMENTS

DE        41 08 73       3/1925

(Continued)

OTHER PUBLICATIONS

Stephen Rossnagel, "The latest on Ru-Cu interconnect technology," Solid State Technology, Feb. 2005 Online, pp. 1-4.

(Continued)

*Primary Examiner*—Caridad M Everhart
(74) *Attorney, Agent, or Firm*—Knobbe, Martens, Olson & Bear LLP

(57) ABSTRACT

A method of forming a Ta—Ru metal liner layer for Cu wiring includes: (i) conducting atomic deposition of Ta X times, each atomic deposition of Ta being accomplished by a pulse of hydrogen plasma, wherein X is an integer such that a surface of an underlying layer is not covered with Ta particles; (ii) after step (i), conducting atomic deposition of Ru Y times, each atomic deposition of Ru being accomplished by a pulse of hydrogen plasma, wherein Y is an integer such that the Ta particles are not covered with Ru particles; and (iii) repeating steps (i) and (ii) Z times, thereby forming a Ta—Ru metal liner layer on a Cu wiring substrate.

16 Claims, 9 Drawing Sheets

U.S. PATENT DOCUMENTS

| | | | |
|---|---|---|---|
| 5,916,365 A | 6/1999 | Sherman et al. |
| 5,923,056 A | 7/1999 | Lee et al. |
| 5,939,334 A | 8/1999 | Nguyen et al. |
| 5,989,672 A | 11/1999 | Hayashi |
| 5,998,048 A | 12/1999 | Jin et al. |
| 6,006,763 A | 12/1999 | Mori et al. |
| 6,015,986 A | 1/2000 | Schuegraf |
| 6,033,584 A | 3/2000 | Ngo et al. |
| 6,040,243 A | 3/2000 | Li et al. |
| 6,063,705 A | 5/2000 | Vaartstra |
| 6,066,892 A | 5/2000 | Ding et al. |
| 6,074,945 A | 6/2000 | Vaartstra et al. |
| 6,108,937 A | 8/2000 | Raaijmakers |
| 6,124,189 A | 9/2000 | Watanabe et al. |
| 6,130,123 A | 10/2000 | Liang et al. |
| 6,133,159 A | 10/2000 | Vaartstra et al. |
| 6,136,163 A | 10/2000 | Cheung et al. |
| 6,139,700 A | 10/2000 | Knag et al. |
| 6,143,658 A | 11/2000 | Donnelly et al. |
| 6,144,060 A | 11/2000 | Park et al. |
| 6,171,910 B1 | 1/2001 | Hobbs et al. |
| 6,203,613 B1 | 3/2001 | Gates et al. |
| 6,268,291 B1 | 7/2001 | Andricacos et al. |
| 6,270,572 B1 | 8/2001 | Kim et al. |
| 6,281,125 B1 | 8/2001 | Vaartstra et al. |
| 6,294,467 B1 | 9/2001 | Yokoyama et al. |
| 6,297,539 B1 | 10/2001 | Ma et al. |
| 6,303,500 B1 | 10/2001 | Jiang et al. |
| 6,305,314 B1 | 10/2001 | Sneh et al. |
| 6,306,756 B1 | 10/2001 | Hasunuma et al. |
| 6,320,213 B1 | 11/2001 | Kirlin et al. |
| 6,323,131 B1 | 11/2001 | Obeng et al. |
| 6,335,280 B1 | 1/2002 | Van der Jeugd |
| 6,342,277 B1 | 1/2002 | Sherman et al. |
| 6,346,151 B1 | 2/2002 | Jiang et al. |
| 6,359,159 B1 | 3/2002 | Welch et al. |
| 6,380,080 B2 | 4/2002 | Visokay |
| 6,391,785 B1 | 5/2002 | Satta et al. |
| 6,395,650 B1 | 5/2002 | Callegari et al. |
| 6,403,414 B2 | 6/2002 | Marsh |
| 6,404,191 B2 | 6/2002 | Daughton et al. |
| 6,420,189 B1 | 7/2002 | Lopatin |
| 6,433,432 B2 | 8/2002 | Shimizu |
| 6,444,568 B1 | 9/2002 | Sundararajan et al. |
| 6,444,868 B1 | 9/2002 | Vaughn et al. |
| 6,455,424 B1 | 9/2002 | McTeer et al. |
| 6,464,779 B1 | 10/2002 | Powell et al. |
| 6,475,276 B1 | 11/2002 | Elers et al. |
| 6,478,931 B1 | 11/2002 | Wadley et al. |
| 6,482,733 B2 | 11/2002 | Raaijmakers et al. |
| 6,482,740 B2 | 11/2002 | Soininen et al. |
| 6,511,539 B1 | 1/2003 | Raaijmakers |
| 6,534,395 B2 | 3/2003 | Werkhoven et al. |
| 6,541,067 B1 | 4/2003 | Marsh et al. |
| 6,551,399 B1 | 4/2003 | Shen et al. |
| 6,576,053 B1 | 6/2003 | Kim et al. |
| 6,593,656 B2 | 7/2003 | Ahn et al. |
| 6,617,173 B1 | 9/2003 | Shen |
| 6,649,091 B2 | 11/2003 | Ryan et al. |
| 6,656,748 B2 | 12/2003 | Hall et al. |
| 6,664,192 B2 | 12/2003 | Satta et al. |
| 6,679,951 B2 | 1/2004 | Soininen et al. |
| 6,680,540 B2 | 1/2004 | Nakano et al. |
| 6,703,708 B2 | 3/2004 | Werkhoven et al. |
| 6,720,262 B2 | 4/2004 | Koh et al. |
| 6,759,325 B2 | 7/2004 | Raaijmakers et al. |
| 6,777,331 B2 | 8/2004 | Nguyen |
| 6,784,101 B1 | 8/2004 | Yu et al. |
| 6,784,504 B2 | 8/2004 | Derderian et al. |
| 6,800,542 B2 | 10/2004 | Kim |
| 6,800,567 B2 | 10/2004 | Cho et al. |
| 6,824,816 B2 | 11/2004 | Aaltonen et al. |
| 6,842,740 B1 | 1/2005 | Jeran et al. |
| 6,849,122 B1 | 2/2005 | Fair |
| 6,852,635 B2 | 2/2005 | Satta et al. |
| 6,878,628 B2 | 4/2005 | Sophie et al. |
| 6,881,260 B2 | 4/2005 | Marsh et al. |
| 6,881,437 B2 | 4/2005 | Ivanov et al. |
| 6,887,795 B2 | 5/2005 | Soininen et al. |
| 6,921,712 B2 | 7/2005 | Soininen et al. |
| 6,933,225 B2 | 8/2005 | Werkhoven et al. |
| 6,936,535 B2 | 8/2005 | Kim et al. |
| 6,955,986 B2 | 10/2005 | Li |
| 6,984,591 B1 | 1/2006 | Buchanan et al. |
| 7,011,981 B2 | 3/2006 | Kim et al. |
| 7,067,407 B2 | 6/2006 | Kostamo et al. |
| 7,105,054 B2 | 9/2006 | Lindfors |
| 7,107,998 B2 | 9/2006 | Greer et al. |
| 7,118,779 B2 | 10/2006 | Verghese et al. |
| 7,135,207 B2 | 11/2006 | Min et al. |
| 7,220,669 B2 | 5/2007 | Hujanen et al. |
| 7,241,677 B2 | 7/2007 | Soininen et al. |
| 7,256,144 B2 | 8/2007 | Koyanagi et al. |
| 7,273,526 B2 | 9/2007 | Shinriki et al. |
| 7,273,814 B2 | 9/2007 | Matsuda |
| 7,300,873 B2 | 11/2007 | Millward |
| 7,404,985 B2 | 7/2008 | Chang et al. |
| 7,419,903 B2 | 9/2008 | Haukka et al. |
| 7,435,484 B2 | 10/2008 | Shinriki et al. |
| 7,438,949 B2 | 10/2008 | Weidman |
| 7,494,927 B2 | 2/2009 | Kostamo et al. |
| 2001/0003064 A1 | 6/2001 | Ohto |
| 2001/0013617 A1 | 8/2001 | Toyoda et al. |
| 2001/0018266 A1 | 8/2001 | Jiang et al. |
| 2001/0030366 A1 | 10/2001 | Nakano et al. |
| 2001/0052318 A1 | 12/2001 | Jiang et al. |
| 2002/0004293 A1 | 1/2002 | Soininen et al. |
| 2002/0006711 A1 | 1/2002 | Yamazaki et al. |
| 2002/0013487 A1 | 1/2002 | Norman et al. |
| 2002/0027286 A1 | 3/2002 | Sundararajan et al. |
| 2002/0173054 A1 | 11/2002 | Kim |
| 2003/0013302 A1 | 1/2003 | Nguyen et al. |
| 2003/0135061 A1 | 7/2003 | Norman et al. |
| 2003/0165615 A1 | 9/2003 | Aaltonen et al. |
| 2003/0214043 A1 | 11/2003 | Saitoh et al. |
| 2003/0233976 A1 | 12/2003 | Marsh et al. |
| 2004/0005753 A1 | 1/2004 | Kostamo et al. |
| 2004/0038529 A1 | 2/2004 | Soininen et al. |
| 2004/0053496 A1 | 3/2004 | Choi |
| 2004/0082125 A1 | 4/2004 | Hou et al. |
| 2004/0087143 A1 | 5/2004 | Norman et al. |
| 2004/0105934 A1 | 6/2004 | Chang et al. |
| 2004/0118697 A1 | 6/2004 | Wen et al. |
| 2004/0126944 A1 | 7/2004 | Rotondaro et al. |
| 2004/0142558 A1 | 7/2004 | Granneman |
| 2004/0152255 A1 | 8/2004 | Seidl et al. |
| 2004/0192021 A1 | 9/2004 | Li |
| 2004/0192036 A1 | 9/2004 | Koyanagi et al. |
| 2004/0214354 A1 | 10/2004 | Marsh et al. |
| 2004/0216668 A1 | 11/2004 | Lindfors et al. |
| 2004/0224475 A1 | 11/2004 | Lee et al. |
| 2005/0009325 A1 | 1/2005 | Chung et al. |
| 2005/0020060 A1 | 1/2005 | Aaltonen et al. |
| 2005/0048794 A1 | 3/2005 | Brask et al. |
| 2005/0082587 A1 | 4/2005 | Marsh |
| 2005/0085031 A1 | 4/2005 | Lopatin et al. |
| 2005/0087879 A1 | 4/2005 | Won et al. |
| 2005/0089632 A1 | 4/2005 | Vehkamaki et al. |
| 2005/0092247 A1 | 5/2005 | Schmidt et al. |
| 2005/0098440 A1 | 5/2005 | Kailasan et al. |
| 2005/0124154 A1 | 6/2005 | Park et al. |
| 2005/0181555 A1 | 8/2005 | Haukka et al. |
| 2005/0208754 A1 | 9/2005 | Kostamo et al. |
| 2005/0229848 A1 | 10/2005 | Shinriki et al. |

| | | | |
|---|---|---|---|
| 2006/0013955 A1 | 1/2006 | Senzaki | |
| 2006/0035462 A1 | 2/2006 | Millward | |
| 2006/0073276 A1 | 4/2006 | Antonissen | |
| 2006/0093848 A1 | 5/2006 | Senkevich et al. | |
| 2006/0118968 A1* | 6/2006 | Johnston et al. | 257/775 |
| 2006/0121733 A1 | 6/2006 | Kilpela et al. | |
| 2006/0128150 A1 | 6/2006 | Gandikota et al. | |
| 2006/0137608 A1 | 6/2006 | Choi et al. | |
| 2006/0177601 A1 | 8/2006 | Park et al. | |
| 2006/0216932 A1 | 9/2006 | Kumar et al. | |
| 2006/0223300 A1* | 10/2006 | Simka et al. | 438/618 |
| 2006/0263977 A1 | 11/2006 | Kim et al. | |
| 2007/0014919 A1 | 1/2007 | Hamalainen et al. | |
| 2007/0026654 A1 | 2/2007 | Huotari et al. | |
| 2007/0036892 A1 | 2/2007 | Haukka et al. | |
| 2007/0059502 A1 | 3/2007 | Wang et al. | |
| 2007/0082132 A1 | 4/2007 | Shinriki et al. | |
| 2007/0190782 A1 | 8/2007 | Park | |
| 2008/0038465 A1 | 2/2008 | Dussurrat | |
| 2008/0054472 A1 | 3/2008 | Shinriki et al. | |
| 2008/0124484 A1 | 5/2008 | Shinriki et al. | |
| 2008/0146042 A1 | 6/2008 | Kostamo et al. | |
| 2008/0171436 A1 | 7/2008 | Koh et al. | |
| 2008/0214003 A1 | 9/2008 | Xia | |
| 2008/0318417 A1 | 12/2008 | Shinriki et al. | |
| 2009/0068832 A1 | 3/2009 | Haukka et al. | |
| 2009/0087339 A1 | 4/2009 | Shinriki | |
| 2009/0104777 A1 | 4/2009 | Kim | |
| 2009/0209101 A1* | 8/2009 | SHINRIKI et al. | 438/686 |

FOREIGN PATENT DOCUMENTS

| | | |
|---|---|---|
| EP | 0 469 456 | 7/1991 |
| EP | 0 469 470 | 2/1992 |
| EP | 0 880 168 A2 | 11/1998 |
| EP | 1 688 923 A2 | 8/2006 |
| GB | 368850 | 12/1930 |
| GB | 1518243 | 7/1978 |
| GB | 2340508 A | 2/2000 |
| JP | 1998-340994 | 12/1998 |
| JP | 2003-168738 A | 6/2003 |
| KR | 10-2001-004717 | 1/2001 |
| KR | 10-2001-004718 | 1/2001 |
| KR | 10-2001-004719 | 1/2001 |
| KR | 10-2001-96408 | 11/2001 |
| KR | 10-2001-112889 | 12/2001 |
| KR | 10-2003-0011399 | 2/2003 |
| KR | 1020050103373 | 10/2005 |
| WO | WO 93/10652 | 5/1993 |
| WO | WO 98/01890 | 1/1998 |
| WO | WO 99/17343 | 4/1999 |
| WO | WO 00/03420 | 1/2000 |
| WO | WO 00/38191 | 6/2000 |
| WO | WO 01/88972 | 5/2001 |
| WO | WO 01/50502 | 7/2001 |
| WO | WO 02/09126 | 7/2001 |
| WO | WO 02/09158 | 7/2001 |
| WO | WO 03/023835 | 3/2003 |
| WO | WO 03/056612 A1 | 7/2003 |
| WO | WO 2004/035858 | 4/2004 |
| WO | WO 2006/035281 | 4/2006 |

OTHER PUBLICATIONS

Growth and characterization of atomic layer deposited WC0.7N0.3 on polymer films, Journal of Applied Physics, Jan. 1, 2004, vol. 95, Issue 1, pp. 381-388.

Kwon et al., Plasma-enhance atomic layer deposition of RuTiN thin films for the applicaiton of copper diffusion barrier, ALD Conference, 2004.

C.-C. Yang, et al., Physical, Electrical, and Reliability Characterization of Ru for Cu Interconnects, 2006 International Interconnect Technology Conference, pp. 187-190, ISBN 1-4244-0103-8/06, 2006 IEEE.

K. Namba et al., PEALD of Ru layer on WNC ALD barrier for Cu/porous low-k integration, Proceedings of Advanced Metallization Conference 2006, p. 39.

Seong-Jun Jeong et al., Plasma Enhanced Atomic Layer Deposition of Ru-TaN Thin Films for the Application of Cu Diffusion Barrier, pp. 1-23, ALD Conference 2006.

I. Shao et al., An alternative low resistance MOL technology with electroplated rhodium as contact plugs for 32nm CMOS and beyond, 2007 International Interconnect Technology Conference, pp. 102-104, ISBN 1-4244-1070-3/07, 2007 IEEE.

V. Arnal et al., Materials and processes for high signal propagation performance and reliable 32 nm node BEOL., 2007 International Interconnect Technology Conference, pp. 1-3, ISBN 1-4244-1069-X/07, 2007 IEEE.

H. Shinriki et al., Ruthenium Alloy Film for Copper Interconnects, U.S. Appl. No. 12/129,345, filed May 29, 2008.

U.S. Appl. No. 11/469,828, filed Sep. 1, 2006, Hiroshi Shinriki, et al.

U.S. Appl. No. 11/557,891, filed Nov. 8, 2006, Hiroshi Shinriki, et al.

U.S. Appl. No. 60/976,378, filed Sep. 28, 2007, Hiroshi Shinriki.

U.S. Appl. No. 10/782,727, filed Feb. 18, 2004, Lindfors et al.

U.S. Appl. No. 11/955,275, filed Dec. 12, 2007, Shinriki.

U.S. Appl. No. 12/129,345, filed May 29, 2008, Shinriki et al.

U.S. Appl. No. 12/201,434, filed Aug. 29, 2008, Shinriki et al.

U.S. Appl. No. 12/337,141, filed Dec. 17, 2008, Kim et al.

U.S. Appl. No. 61/178,871, filed May 15, 2009, Hamalainen et al.

Aaltonen et al., "Atomic Layer Deposition of Ruthenium Thin Films from Ru(thd)3 and Oxygen," Chem. Vap. Deposition, 10, pp. 25-219.

Aaltonen et al., "Reaction Mechanism Studies on Atomic Layer Deposition of Ruthenium and Platinum," Electrochem. Solid-State Lett., 6 (2003), C130-133.

Aaltonen et al., "ALD of Rhodium Thin Films from RH (acac)$_3$ and Oxygen," Electrochem. Solid-State Lett. 8 (8): C99-C101 (2005).

Aaltonen et al., "Atomic Layer Deposition of Iridum Thin Films," J. Electrochem. Soc. 151(8): G489-G492 (2004).

Aaltonen et al., "Atomic Layer Deposition of Noble Metal Thin Films," dissertation presented at University of Helsinki, Helsinki, Finland, 2005.

Aaltonen et al., "Atomic Layer Deposition of Noble Metals: Exploration of the Low Limit of the Deposition Temperature," J. Mat. Res. Soc. 19(11): 3353-3358 (2004).

Aaltonen et al., "Atomic Layer Deposition of Platinum Thin Films," Chem. Mater. 15:1924-1928 (2003).

Akerman et al., "Identifying Tunneling in Ferromagnetic-Insulator-Ferromagnetic Thin Film Structures," World Wide Web, physics. ucsd.edu/iksgrp/Tunneling.html, pp. 1-6.

Addison et al., "The Vapour Pressure of Anhydrous Copper Nitrate and its Molecular Weight in the Vapour State," J.Chem. Soc., pp. 3099-3106 (1958).

Aoyama et al., "Chemical Vapor Deposition of Ru and Its Application in (Ba, Sr) TiO3 Capacitors for Future Dynamic Random Access Memories," Jpn. J. Appl. Phys. 38(43): 2194-2199 (1999).

Baklanov et al., "Characterization of Cu surface cleaning by hydrogen plasma," Journal Vac. Sci. Technol. 19(4): 1201-1211 (2001).

Balgia, J., Associate Editor, "New designs and materials tackle 1 Gb memory challenges," Semiconductor Internationa, World Wide Web address: semiconductor.net, Nov. 2000.

Basceri, C. Ph.D. thesis, "Electrical and Dielectric Properties of (BA, SR) TiO3 Thin Film Capacitors for Ultra-High Density Dynamic Random Access Memories," 1997, pp. 13-31, Raleigh, N.C. State University.

Bobo et al., Spin Dependent Tunneling Junctions with Hard Magnetic Layer Pinning, Journal of Applied Physics, vol. 83, No. 11, pp. 6685-6687, (1998).

Bursky, "Hit Up IEDM For Gigabit And Denser DRAMs and Merged Logic/Memory," Electronic Design, World Wide Web address: planetee.com, Dec. 1, 1998.

Campbell et al., "Titanium dioxide (Ti02)-based gate insulators," IBM J. Res. Develop., May 1999, pp. 383-392, vol. 43, No. 3.

Daughton, World Wide Web nve.com/otherbiz/mram2.pdf "Advanced MRAM Co ncepts," p. 1-6, (Feb. 7, 2001).

Fereday et al., "Anhydrous Cobalt (III) Nitrate," Chemical Communications, p. 271 (1968).

Fukuzumi et al., "Liner-Supported Cylinder (LSC) Technology to Realize RU/Ta$_2$O$_5$/Ru Capacitor for Future DRAMs," IEEE, IED 2000, Session 34 (2000).

Fullerton et al., "Advanced Magnetic Recording Media for High-Density Data," Solid State Technology 44(i9): 87 (2001).

Hones et al., "MOCVD of Thin Ruthenium Oxide Films: Properties and Growth Kinetics," Chem. Vap. Deposition 6(4): 193-198 (2000).

Hu et al., "In situ rapid thermal oxidation and reduction of copper thin films and their applications in ultralarge scale integration," Journal of The Electrochemical Society 148(12): G669-G675 (2001).

Imai, Tajuki World Wide Web nikkeibp.asiabiztech.com/nea/200 008/tech_108675.html, 100 Gbit/Inch HDD Just Around the Corner, p. 1-6 (Aug. 2000).

Inoue et al., "Low thermal-budget fabrication of sputtered-PZT capacitor on multilevel interconnects for embedded FeRAM," IEEE, IED 2000, 2000, Session 34.

Integrated Circuit Engineering Corporation, Practical Integrated Circuit Fabrication Seminar (1998).

Jung et al., "A Novel Ir/IrO$_2$-Pt-PZT-Pt/IrO$_2$/Ir Capacitor for a Highly Reliable Mega-Scale FRAM," IEEE, IED 2000, Session 34 (2000).

Kawaguchi, "MPEG1 Decoder LSI for video CD µPD61012," *NEC Device Technology International*. New Products 5 No. 48, pp. 4-8 (Jan. 1998).

Kawamoto et at "The Outlook for Semiconductor Processes and Manufacturing Technologies in the 0.1-µm Age," Hitachi Review 48(6): 334-339 (1999).

Kwon et al., "Ruthenium Bottom Electrode Prepared for Electroplating for a High Density DRAM Capacitor," J. Electrochem. Soc. 151(2): C127-C132 (2004.).

Kwon et al., "Plasma-enhanced Atomic Layer Deposition of Ruthenium Thin Films," Electrochemical and Solid-State Letters, 7(4), C46-C48 (2004).

Lee et al., "Electroless CoWP boosts copper reliability, device performance," Semiconductor International, Jul. 1, 2004, 5 pages.

NEC Device Technology International, "Current state of leading edge ULSI process technology and future trends," No. 48, pp. 4-8 (1998).

Nilsen et al., "Thin Film Deposition of Lanthanum Manganite Perovskite by the ALE process," Journal of Materials Chemistry, vol. 9, 1781-1784 (1999).

Onda et al., "Hydrogen plasma cleaning a novel process for IC-packaging," SEMICON WEST 97, Packaging Materials Conference, 1997, pp. D-1-D-10.

Pakrad, "Pure Tech: Growth of MR/GMR Head Materials," World Wide Web, Puretechinc.com/tech_papers/tech_papers-4.htm, pp. 1-2 (1999.).

Paranjpe et al., "Atomic Layer Deposition of AlOx for thin Film Head Gap Applications," Journal of Electrochemical Society, V 148(9), G 465-G471.

Parsons et al., "Microcontact Patterning of Ruthenium Gate Electrodes by Selective Area, "North Carolina State University, presentation at AVS conference on Atomic Layer Deposition (ALD 2004), Helsinki Finland, Aug. 16, 2004.

Ritala et al., "Atomic Layer Deposition," Handbook of Thin Film Materials vol. 1: Deposition and Processing of Thin Films, chapter 2, pp. 103-159 (2002).

Sakurai et al., "Adsorption of ruthenium tetroxide on metal surfaces," *J. Phys., Chem. American Chemical Society*, vol. 89, pp. 1892-1896 (1985).

Satta et al., "The Removal of Copper Oxides by Ethyl Alcohol Monitored in Situ by Spectroscopic Ellipsometry," Journal of the Electrochemical Society, 150 (5), pp. 300-306 (2003).

Singer, "Progress in Copper: A Look Ahead," Semiconductor International, May 1, 2002.

Soi Technology: IMB's Next Advance in Chip Design, 1998.

Solanki et al., "Atomic Layer Deposition of Copper Seed Layers," Electrochemical and Solid-State Letters 3(10): 479-480 (2000).

Sundani et al., "Oral Presentation of Dual Damascene Process," slides, Nov. 19, 1998.

Suntola, "Atomic Layer Epitaxy," Handbook of Crystal Growth, vol. 3, chapter 14, pp. 601-663 (1994).

Ueno et al., "Cleaning of the CHF3 plasma-etched SiO2/SiN/Cu via Structures Using a Hydrogen Plasma, an Oxygen Plasma and Hexafluoracetylacetone vapors," J. Vac. Sci. Technology B. vol. 16, No. 6, pp. 2986-2995 (1998).

Utrianen et al., "Studies of metallic thin film growth in an atomic layer epitaxy reactor using M(acac)2 (M=Ni, Cu, Pt) precursors," Applied Surface Science 157: 151-158 (2000).

Utrianen et al., "Studies of NiO thin film formation by atomic layer epitaxy," Materials Science and Engineering B54: 98-103 (1998).

Wang, "Advanced Materials for Extremely High Density Magnetic Recording Heads," Department of Materials Science and Engineering, Department of Electrical Engineering, Stanford University, Stanford, CA 94305-4045, presentation.

Winbond News Release, "Successful development of capacitor technology for next generation memory," World Wide Web address: winbond.com, Dec. 13, 2000.

Won et al., "Conformal CVD-ruthenium process for MIM capacitor in giga-bit DRAMs," IEEE, IED 2000, Session 34 (2000).

World Wide Web, magahaus.com/tech/westerndigital/shitepapers/gmr_wp.shtml,"GMR Head Technology: Increased Areal Density and Improved Areal Density," pp. 1-4 (Feb. 2000).

World Wide Web, pc.guide.com/ref/hdd/op/heads/techGMR-c.html, "Giant Magnetoresistive (GMR) Heads," pp. 1-4.

World Wide web, semiconductor.net/semiconductor/issues/Issues/1998/feb98/docs/emerging.asp, "GMR Read-Write Heads Yield Data Storage Record," pp. 1 (Feb. 1998).

World Wide Web, stoner.leeds.ac.uk/research/gmr.htm, "Giant Magnetoresistance," pp. 1-6.

Xu et al. "A breakthrough in low-k barrier/etch stop films for copper damascene applications," Semiconductor Fabtech, 2000, pp. 239-244, 11$^{th}$ Edtion.

Yagishita et al., "Cleaning of Copper Surface Using Vapor-Phase Organic Acids," MRS Proceedings, vol. 766, MRS Spring 2003 Meeting, Apr. 21-25, 2003, Symposium E, Session E3, Paper E3.28.

Yoon et al., "Development of an RTA process for the enhanced crystallization of amorphous silicon thin film," Electrochemical Society Proceedings 2000-9: 337-343 (2000).

Yoon et al., "investigation of RuO2-incorporated Pt layer as a Bottom Electrode and Diffusion Barrier for High Epsilon Capacitor Applications," Electrochemical and Solid-State Letters 3(8): 373-376 (2000).

Yoon et al., "Tantalum-ruthenium dioxide as a diffusion barrier between Pt bottom electrode and TiSi2 ohmic contact layer for high density capacitors," Journal of Applied Physics 86(5): 2544-2549 (1999).

Yoon, Y.-G. et al., 197th Meeting Program Information II, The Electrochemical Society, 197th Meeting- Toronto, Ontario, Canada, May 14-18, 2000, Program Information, I1-Rapid Thermal and Other Short-Time Processing Technologies I, Electronics Division/Dielectric Science and Technology Division/High Temperature Materials Division, 2000, Wednesday, May 17, 2000, New Applications of RTP, Co-Chairs: A. Fiory and D.-L Kwong, time 11:10 Abs#550, Title: Development of RTA Process for the Crystallization of a—Si Thin Film—Y.-G. Yoong, T.-K. Kim, K.-B. Kim J.-Y. Chio, B.-I. Lee, and S.-K. Joo (Seoul National Univ.).

* cited by examiner

METHOD FOR FORMING TA-RU LINER LAYER FOR CU WIRING

BACKGROUND OF THE INVENTION

1. Field of the Invention

The present invention relates to a method for forming a Cu diffusion barrier metal for metal wiring structures that can be used favorably in the creation of fine semiconductor elements in general, as well as a structure of said Cu diffusion barrier metal.

2. Description of the Related Art

Ru film is drawing the attention for its ability to improve the adhesion property with respect to Cu and thereby enhance the wiring reliability significantly when a Ru film is formed at the boundary of Cu and barrier metal in a Cu wiring structure, which is a main wiring structure used in high-speed logic elements such as MPUs. Methods are studied whereby a Ru film comprising a Cu wiring liner is formed on top of a TaN film or WN film and then a Cu film is formed on top of the Ru film (one example of such method based on a combination of Ru and TaN is found in "Physical, Electrical, and Reliability Characterization of Ru for Cu Interconnects" by C-C Yong, et al., IITC 2006, pp. 187-189).

A Ru/TaN laminated film whose use as a Cu wiring liner is being examined tends to produce higher Cu wiring resistivity because the thicker the film, the smaller the Cu wiring volume becomes. Accordingly, reducing the film thickness of the Cu wiring liner is essential in reducing the resistivity resulting from smaller wiring widths and use of thinner Cu wires. Accordingly, forming a film offering greater coverage using the atomic layer deposition method is drawing more attention compared with the traditional PVD method.

As far as adhesion property is concerned, traditionally a Cu liner such as a PVD-Ta film or PVD-TaN film can be formed in a manner similar to driving a wedge, because physically accelerated ions collide with the surface to be coated in the PVD method. Accordingly, good adhesion property can be maintained, even when a PVD-TaN film is formed on a Cu film in the bottom wiring layer, because the TaN film is formed in a manner biting into the Cu film. On the other hand, a TaN film formed by the atomic layer deposition method has been shown to reduce the adhesion property with respect to Cu wiring. Unlike in PVD, under the atomic layer deposition method where a film is formed by means of chemical reaction an area where a mixture of different atoms is present is not formed between the bottom Cu wiring layer and the metal film comprising the Cu liner, and therefore if a TaN film, TaNC film or other Cu barrier metal is formed, good adhesion property is difficult to maintain compared to when the PVD method is used. Sandwiching a Ru film between the Cu film and the TaN film or TaNC film is expected to produce good adhesion property.

If a multi-layer Cu wiring structure is formed, many via holes must be formed that serve as connection holes through which to connect the top and bottom Cu wirings. In general, a dual damascene structure is used in these applications, and thus the following explanation assumes use of a dual damascene structure. A Cu film is formed over the via holes and trenches in the bottom Cu wiring layer, after which Cu wiring pattern is formed. This is to prevent Cu from diffusing into the inter-layer insulation film and consequently increasing the leak current to cause insulation failure. If this Cu barrier metal has poor adhesion property with respect to Cu, however, the Cu film will separate during the reliability test and voids will form. Accordingly, it is desirable to form a Ru film at the interface of Cu wiring and Cu barrier metal, as shown in known examples. However, forming a Ru film over the Cu wiring exposed at the bottom of via holes normally results in poor adhesion property at the interface of inter-layer insulation film and Ru. As a method to solve this problem, Seong-Jun Jeong et al. made a presentation under the following title at ALD Conference 2006: "Plasma Enhanced Atomic Layer Deposition of Ru—TaN Thin Films for the Application of Cu Diffusion Barrier."

The above paper proposes a method to create a metal alloy film comprised of Ta and Ru between the Cu film of the bottom layer and the Cu film of the top layer by repeating a step to introduce Ta material, step to purge Ta material, step to introduce hydrogen gas and apply high-frequency plasma, step to purge hydrogen gas, step to introduce Ru material, step to purge Ru material, step to introduce ammonia gas and apply high-frequency plasma, and step to purge ammonia gas. In this case, the researches indicate that good adhesion property can be achieved with respect to both the top and bottom Cu films as well as dielectric layers because an alloy of Ta and Ru is formed. Based on the result of an experiment conducted by the inventors of the present invention, however, it is difficult to break down the material and form a Ru film, unless $NH_3$ plasma is used, when $Ru(EtCp)_2$ is to be used as an organic metal material containing Ru metal atoms as indicated in the aforementioned paper. However, using $NH_3$ plasma accelerates the nitriding of the Ta layer formed at the bottom and causes the film resistivity to increase significantly. In other words, Ta will be nitrided by ammonia plasma to form a high-resistivity component of $Ta_3N_5$ or a high-resistivity film of relatively high nitrogen content. Accordingly, applying the present invention to via holes connecting the Cu wirings of the top and bottom layers, which is the objective of the aforementioned known example, increases the via resistivity and reduces the wiring reliability.

To lower the wiring resistivity, the amount of Ru must be increased. Accordingly, adhesion property with respect to the insulation film tends to decrease when the amount of Ru is increased. Particularly when Ru is used as a Cu wiring liner, the interface with the bottom layer consists of Cu and an inter-layer insulation film, while the interface with the top layer consists of a Cu wiring only. This difference makes it difficult to achieve good adhesion property at the top and bottom interfaces using a film of the same quality.

In Korean Patent Publication No. 10-2005-0103373, a method is presented whereby a film containing amorphous Ru and Ta is formed and used as a Cu barrier film by repeating the first atomic layer deposition process consisting of a step to introduce Ru material, step to purge Ru material, step to introduce ammonia gas and apply high-frequency plasma, and step to purge ammonia gas, as well as the second atomic layer deposition process consisting of a step to introduce Ta material, step to purge Ta material, step to introduce hydrogen gas and apply high-frequency plasma, and step to purge hydrogen gas.

As is the case with the first known example, however, under this method it is also difficult to achieve good wiring reliability for the top and bottom layers with an alloy of amorphous Ta and Ru alone, because Ru offers better adhesion property with respect to Cu in the top layer, while TaN offers better adhesion property with respect to the inter-layer insulation film in the bottom layer. Even if an Ta—Ru alloy film is effective as a copper diffusion barrier, problems occur easily when current is applied, such as the barrier film separating from the Cu film to form voids or the barrier film and inter-layer insulation film separating from each other. Accordingly, a desirable structure is one that maintains adhesion property with respect to the bottom Cu wiring layer, offers excellent Cu diffusion barrier property, and also provides good adhesion property with respect to the top Cu wiring layer.

SUMMARY OF THE INVENTION

In view of the above, the inventors examined a method to form a Cu wiring liner that can satisfy the required adhesion property with respect to the top/bottom layers and Cu diffusion barrier property, as well as a structure of said liner. The results are explained using an example of forming an optimal liner based on a dual damascene structure. Here, it should be noted that the present invention is not at all limited to this example. First, it is desirable to use hydrogen or other gas not containing $NH_3$, $N_2$ or any other nitrogen molecule so that a Ru layer can be formed without promoting the nitriding of Ta in the bottom layer. With $Ru(EtCp)_2$ used in the known example, a Ru film could not be formed using hydrogen gas or hydrogen plasma. As shown in the known example, plasma generated by a $H_2/N_2$ mixed gas, or $NH_3$ plasma, is required in this condition. As shown in the known example, however, in this case the TaNC layer tends to form $Ta_3N_5$ to become a high-resistivity layer due to the nitriding of Ta atoms by $NH_3$ plasma used in the atomic layer deposition process of Ru. Accordingly, via holes in the wiring created by this method tend to have higher-than-normal resistivity.

The inventors found an optimal combination of Ta material and Ru material that allows for forming of a film by means of hydrogen plasma. Based on this combination, a Cu wiring liner can be formed by utilizing the atomic layer deposition of Ta and Ru, without causing Ta to be nitrided more than necessary.

In an embodiment, the present invention provides a method of forming a Ta—Ru metal liner layer for Cu wiring, comprising: (i) conducting atomic deposition of Ta X times, each atomic deposition of Ta being accomplished by a pulse of hydrogen plasma, wherein X is an integer such that a surface of an underlying layer is not covered with Ta particles; (ii) after step (i), conducting atomic deposition of Ru Y times, each atomic deposition of Ru being accomplished by a pulse of hydrogen plasma, wherein Y is an integer such that the Ta particles are not covered with Ru particles; and (iii) repeating steps (i) and (ii) Z times, thereby forming a Ta—Ru metal liner layer on a Cu wiring substrate.

The above embodiment further includes, but is not limited to, the following embodiments:

In an embodiment, X is an integer of 1 or 2, and Y may be an integer of 1 to 10. In another embodiment, X may be an integer of 1, and Y is an integer of 2 to 6. In an embodiment, Z may be an integer of 5 to 10.

In any of the foregoing embodiments, the method may further comprise, after step (iii): (iv) changing X, Y, and Z, and conducting steps (i) to (iii), thereby forming a second metal layer on the Ta—Ru metal liner layer which is a first metal layer. In an embodiment, the method may further comprise, after step (iv): (v) changing X, Y, and Z, and conducting steps (i) to (iii), thereby forming a third metal layer on the second metal liner layer. In any of the foregoing embodiments, Y for the second metal layer may be zero, and X for the third metal layer may be zero. In any of the foregoing embodiments, X, Y, and Z for the first metal layer are X1, Y1, and Z1, X, Y, and Z for the second metal layer are X2, Y2, and Z2, X, Y, and Z for the third metal layer are X3, Y3, and Z3, wherein X1=1, Y1=2-10, Z1=5-10, X2=1, Y2=0, Z2=30-60, X3=0, Y3=1, and Z3=50-100.

In the above, in an embodiment, a ratio of X/Y for the second metal layer may be greater than a ratio of X/Y for each of the first and third metal layers. In another embodiment, a ratio of X/Y for the third metal layer may be smaller than a ratio of X/Y for each of the first and second metal layers.

In any of the foregoing embodiments, step (i) may comprise supplying a precursor vapor containing Ta into a reaction chamber and applying a pulse of hydrogen plasma to the vapor X times. In an embodiment, the precursor vapor containing Ta may be at least one selected from the group consisting of TAIMATA (Tertiaryamylimidotris(dimethylamido)-tantalum), TBTDET (Ta(N-i-C4H9)[N(C2H5)2]3), and PDMAT (Ta[N(CH3)2]5).

In any of the foregoing embodiments, step (ii) may comprise supplying a precursor vapor containing Ru into a reaction chamber and applying a pulse of hydrogen plasma to the vapor Y times. In an embodiment, the precursor vapor containing Ru may be β-diketone-coordinated ruthenium compound.

In any of the foregoing embodiments, the hydrogen plasma in steps (i) and (ii) may be generated by applying RF power to a gas containing hydrogen.

In any of the foregoing embodiments, the Cu wiring substrate on which the Ta—Ru metal liner layer is formed may be comprised of a metal film, a metal silicide film, and dielectric film.

The present invention can equally applied to a Ta—Ru metal liner layer for Cu wiring. In an embodiment, the present invention provides a Ta—Ru metal liner layer for Cu wiring, comprising a plurality of Ru-doped Ta atomic deposition layers formed on a Cu wiring substrate, each layer being formed by: (i) conducting atomic deposition of Ta X times, each atomic deposition of Ta being accomplished by a pulse of hydrogen plasma, wherein X is an integer such that a surface of an underlying layer is not covered with Ta particles; and (ii) after step (i), conducting atomic deposition of Ru Y times, each atomic deposition of Ru being accomplished by a pulse of hydrogen plasma, wherein Y is an integer such that the Ta particles are not covered with Ru particles. The above embodiment can further include any of the foregoing embodiments.

For purposes of summarizing the invention and the advantages achieved over the prior art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

Description of the Symbols

Figure 1:
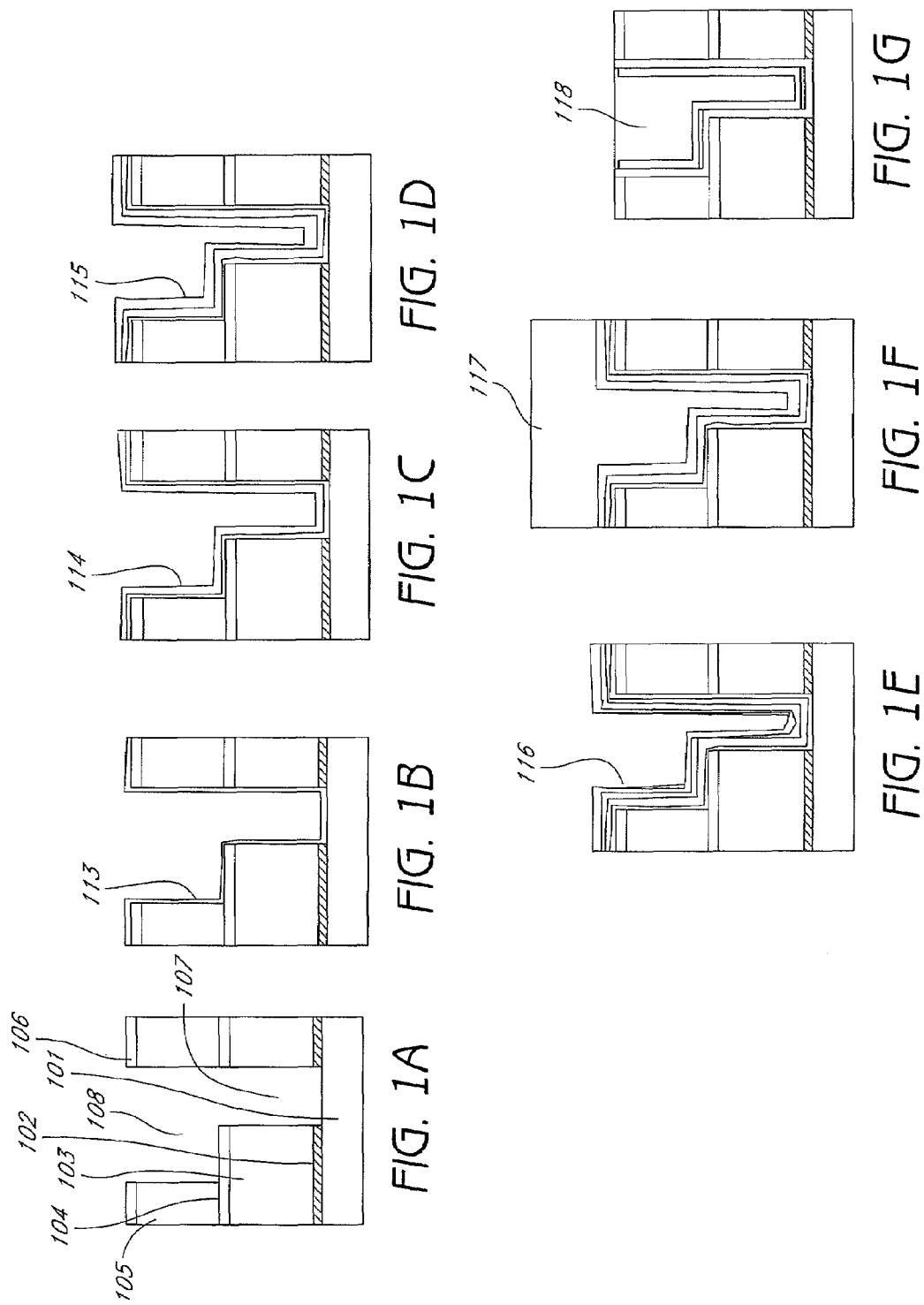
FIG. 1A-1G is a schematic drawing explaining a method for forming a metal liner film for Cu wiring in a dual damascene structure, as well as a structure of said liner film, used in an embodiment of the present invention.

101: Bottom copper wiring layer
102: Copper diffusion barrier insulation film comprised of SiC
103: Inter-layer insulation film
104: Etching stop film
105: Inter-layer insulation film
106: Etching stop layer
107: Dual damascene via hole
108: Dual damascene trench
113: Ta-Ru metal layer
114: TaN-TaNC metal film
115: Ru film
116: Cu seed film
117: Cu plating
118: Cu wiring
301: Reactor interior
302: Showerhead
303: Substrate heating stage
304: Exhaust for evacuation
305: Material-gas mixing introduction port
306: Argon purge valve for Ta supply line
307: Ta material introduction valve
308: Argon purge valve for Ru supply line
309: Ru material introduction valve
310: Argon introduction valve
311: Hydrogen gas introduction valve
312: Ru material carrier argon bypass valve
313: Ru material supply OUT valve
314: Argon carrier introduction valve to Ru material
315: Ta material carrier argon bypass valve
316: Ta material supply OUT valve
317: Argon carrier introduction valve to Ta material
318: Argon-gas flow rate controller for Ru material carrier gas
319: Argon-gas flow rate controller for Ta material carrier gas
320: Hydrogen-gas flow rate controller
321: Argon-gas flow rate controller
322: Ru material bottle
323: Ru material
324: Ta material bottle
325: Ta material
201: Cassette loader
202: Atmospheric transfer robot chamber
203: Load lock chamber
204: Vacuum transfer robot chamber
205: Ru film, TaNC film formation module 1
206: Ru film, TaNC film formation module 2
207: Ru film, TaNC film formation module 3
208: Ar carrier gas supply part
209: Ru material supply part
210: Ta material supply part
211: Hydrogen gas supply part -continued Description of the Symbols 212: Ru precursor supply pipe
213: Ta precursor supply pipe
214: Hydrogen gas supply pipe
400: Test via chain pattern
401: PVD-Ta/TaN Cu liner
402: Cu diffusion barrier comprised of SiC
403: Bottom Cu wiring layer
404: Ta-Ru metal liner
405: Via hole
406: Top Cu wiring layer
407: Cu diffusion barrier comprised of SiC

DETAILED DESCRIPTION OF THE PREFERRED EMBODIMENT

The present invention will be explained in detail with reference to preferred embodiments. However, the preferred embodiments are not intended to limit the present invention.

1) An embodiment of the present invention provides a method for forming a Ta—Ru metal liner film for Cu wiring, as well as an atomic deposition film having a structure obtained from said method; wherein said method is characterized in that a metal liner film is formed by repeating multiple (Z) times the first process where a step to supply a material vapor comprised of Ta atoms is supplied onto a substrate, and a step to supply the first reactant gas produced by exciting at least hydrogen gas by means of high frequency, are repeated at least X times, and the second process where a step to supply a material vapor comprised of Ru atoms, and a step to supply the first reactant gas produced by exciting at least hydrogen gas by means of high frequency, are repeated at least Y times.

Here, X and Y are typically constant in the same metal film production process, but they can also be changed every time the first process and second process are performed. In other words, X and Y may be different every time Z changes.

2) In an embodiment conforming to 1) above, a Ta—Ru metal liner film for Cu wiring is formed by repeating the aforementioned metal film production processes multiple times using specified values of X and Y.

3) In an embodiment conforming to 2) above, X is set to either 1 or 2 and Y is selected from 1 to 10 in the first metal film production process, while X is set to 1 or greater and Y is set to 0 in the second metal film production process, and while X is set to 0 and Y is set to 1 or greater in the third production process, to form a metal liner film for Cu wiring that consists of the first Ta—Ru metal film layer, second metal film layer containing Ta atoms, and third metal film layer containing Ru atoms.

For your reference, even if $X \geq Y$ (such as X=2, Y=1) is true in the first production process, the thickness of a formed film is 0.5 Å at X=1 and 1 Å at X=2, which are smaller than a normal single atomic layer. Accordingly, the Ru film (0.2 Å) is buried and thus a desired first metal film can be formed. However, typically $X \leq Y$ is true in consideration of the sizes of respective molecules.

If either X or Y is 0, the values of X and Y are the same as the value of Z.

It is also possible to gradually change X and Y using variables, instead of using constants, in the first through third metal film production processes (if X=1 and Y=3 in the first metal film production process, and X=1 and Y=0 in the second metal film production process, for example, X and Y are changed gradually in the sequence of (X=1, Y=3)→(X=1, Y=2)→(X=1, Y=1)→(X=1, Y=0) immediately before the second metal film production process as Z changes). Since changing the detailed composition with each Z is difficult in reality, however, typically a simpler two-layer or three-layer structure is used.

4) In an embodiment conforming to 2) above, X is set to either 1 or 2 and Y is selected from 1 to 10 in the first metal film production process, while X is set to 0 and Y is set to 1 or greater in the second metal film production process, to form a Ta—Ru metal liner film for Cu wiring, which in turns is comprised of the first Ta—Ru metal film layer and the second metal film layer containing Ru atoms.

5) In an embodiment conforming to 2) above, a Ta—Ru metal liner film for Cu wiring is formed, wherein the X/Y ratio of the metal film comprising the intermediate layer is greater than the X/Y ratios of the metal films comprising the top and bottom layers in each of the multiple metal film production processes.

6) In an embodiment conforming to 2) above, a Ta—Ru metal liner film for Cu wiring is formed, wherein the X/Y ratio of the metal film comprising the bottom layer is greater than the X/Y ratio of the metal film comprising the top layer in each of the multiple metal film production processes.

7) In an embodiment conforming to any one of 1) through 6) above, a diffusion barrier metal film for Cu wiring containing Ta and Ru is formed, wherein the material vapor containing Ta atoms consists of at least one type of material selected from TAIMATA: (Tertiaryamylimidotris(dimethylamido) tantalum, TBTDET: $(Ta(N-i-C_4H_9)[N(C_2H_5)_2]_3$ and PDMAT: $(Ta[N(CH_3)_2]_5$.

8) In an embodiment conforming to any one of 1) through 6) above, a liner film for Cu containing Ta and Ru is formed, wherein the material vapor containing Ru atoms has two ligands, each comprised of a β diketone group. Any of the following chemicals can be used as the material containing Ru atoms.

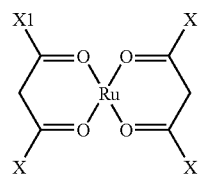

(1)

wherein X1 and X2 are each independently CH3, C(CH3)3, CH(CH3)2, or CH2(CH3).

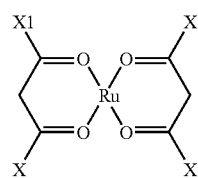

(2)

wherein X1 to X4 are each independently CH3, C(CH3)3, CH(CH3)2, or CH2(CH3), with a proviso that if X1 and X4 are the same, X2 and X3 are different.

In addition to the above, any Ru-containing compounds disclosed in U.S. patent application Ser. No. 11/469,828 and No. 11/557,891 and U.S. Provisional Application No. 60/976, 378, all of which are owned by the same assignee as in the present application, can be used in embodiments (the disclosure of the above applications is herein incorporated by reference in their entirety).

9) In an embodiment conforming to any one of 1) through 8) above, a liner film for Cu wiring containing Ta and Ru is formed, wherein the substrate on which the metal film is formed has a metal film, metal silicide film or dielectric film formed on it.

The present invention will be explained in detail with reference to drawings showing preferred embodiments of the present invention. However, the drawings are not intended to limit the present invention. In the present disclosure where conditions and/or structures are not specified, the skilled artisan in the art can readily provide such conditions and/or structures, in view of the present disclosure, as a matter of routine experimentation. Additionally, in the present disclosure, the numerical numbers applied in embodiments can be modified by a range of at least ±50% in other embodiments, and the ranges applied in embodiments may include or exclude the endpoints.

FIG. 1(a) shows a bottom copper wiring layer 101 and a copper diffusion barrier insulation film comprised of SiC 102, on which an inter-layer insulation film 103, etching stop film 104, inter-layer insulation film 105 and etching stop layer 106 are formed, and there are also dual damascene via holes 107 and trenches 108 where a Cu wiring pattern is formed.

113 in FIG. 1(b) is a Ta—Ru metal layer. As shown in FIG. 2, a metal layer containing Ta and Ru can be formed by repeating Z times the first atomic layer deposition process consisting of a step to introduce Ta material, step to purge Ta material, step to introduce hydrogen gas and apply high-frequency plasma, and step to purge hydrogen gas, where these steps are repeated X times, and the second atomic layer deposition process consisting of a step to introduce Ru material, step to purge Ru material, step to introduce hydrogen gas and apply high-frequency plasma, and step to purge hydrogen gas, where these steps are repeated Y times.

The inventors found that Ru would be formed by hydrogen plasma by using as the optimal Ru material a Ru organic metal material containing β diketone, as shown in chemical formulas (1) and (2) above. Here, X is normally 1 and Y may preferably be optimized in a range of 2 to 10. Considering that the thickness of formed film is normally 0.5 Å A per cycle in the Ta atomic layer deposition process or 0.2 Å per cycle in the Ru atomic layer deposition process, repeating the Ta atomic layer deposition cycle three times or more causes nearly the entire interface with the bottom layer to be covered with a TaN or TaNC layer, which makes is difficult to form Ru on the Cu wiring in the next Ru process.

Accordingly, X may preferably be 1 or 2. Y may preferably be in a range of 2 to 10 because the low Ru deposition speed makes it difficult to cover the surface with Ru even when the process is repeated 10 times, and thus a number of cycles where a complete Ru layer is not formed is preferable in achieving an optimal mixing of Ta and Ru in the metal layer. If X is set to 1 and Y to 3, for example, setting the repletion count of Z to around 5 to 10 will allow for formation of a film 113 of approximately. 5 to 10 Å. Here, the fact that a single atomic layer cannot be formed by performing a normal Ta atomic layer deposition process and Ru atomic layer deposition process only once, requires attention. To be specific, after both Ta material and Ru material have been adsorbed the hydrogen plasma reaction causes the ligands to dissociates, resulting in an atomic layer filled with voids. Accordingly, a single atomic layer can be formed only when these atomic layer deposition processes are repeated multiple times. For this reason, performing the Ta atomic layer deposition process once and then performing the Ru atomic layer deposition process produces a structure where Ru atoms have entered between Ta atoms, which causes both Ta and Ru to exist at the interface of the metal layer 113 and bottom Cu wiring layer 101 and consequently improves the adhesion property with respect to Cu wiring.

Next, a metal layer 114 is formed in FIG. 1(c). As shown in chemical formulas (1) and (2), this 114 is a Cu diffusion metal barrier film comprised of TaN or TaNC, which is formed by performing the Ta atomic layer deposition process. A TaN or TaNC film formed by hydrogen plasma is denser than a film achieved by the thermal atomic layer deposition method, and is therefore suitable for use as a copper diffusion barrier film. Accordingly, greater Cu diffusion barrier property can be achieved by forming a metal film 114 comprised of TaN or TaNC on top of a Ta—Ru metal layer 113 that utilizes the adhesion property between bottom Cu wiring layer and inter-layer insulation film.

Figure 4:
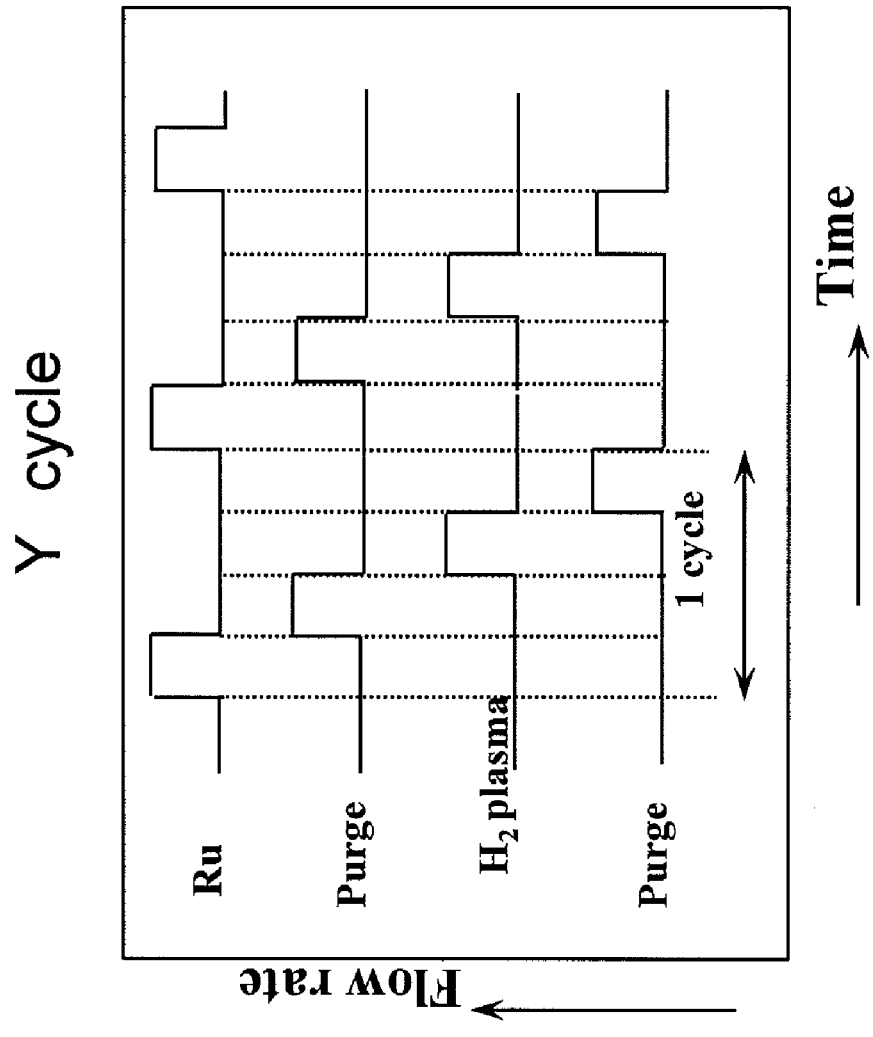
FIG. 4 is a schematic drawing showing a process of forming a Ru film used in an embodiment of the present invention.

In FIG. 1(d), a Ru film 115 is formed on top of a metal film 114 by the Ru atomic layer deposition process shown in FIG. 4. Since the metal film 114 comprising the top layer functions as a liner for the Cu wiring comprising the top layer, adhesion property with respect to Cu is important and it is best to use a Ru film. Normally a Ru film of approximately. 1 to 2 nm is formed over 50 to 100 cycles.

In FIG. 1(e), a Cu seed film 116 is formed on top of a metal film 114 by, for example, the PVD method.

In FIG. 1(f), a Cu plating 117 is formed on a Cu seed film 116.

FIG. 1(g) shows a cross-section structure where a Cu wiring 118 is formed by CMP after a Cu plating layer 117 has been formed.

This structure forms a metal layer 113 containing Ta and Ru that has good adhesion property with respect to the bottom Cu wiring layer and inter-layer insulation film. Furthermore, a Ta—Ru metal layer offering excellent Cu diffusion barrier property, or a Ta-based metal layer 114 such as TaN or TaNC layer, is formed and then a Ru layer 115 offering good adhesion property with respect to the top Cu wiring layer is formed successively. Although TaN or TaNC is the best choice for Cu diffusion barrier layer, a film in which Ru has been added can also be used. As shown in the known example, instead of achieving adhesion property and Cu barrier property using Ta/Ru alloy films of the same composition, it is more preferable, from the viewpoint of productivity, to successively form a Cu film as the bottom layer, a metal layer having good adhesion property with respect to the inter-layer insulation film of the bottom layer, a metal layer that functions as an excellent Cu diffusion barrier, and a metal film offering excellent adhesion property with respect to the top Cu wiring layer, respectively based on optimal compositions, by controlling the pulse cycles for Ta and Ru.

Figure 2:
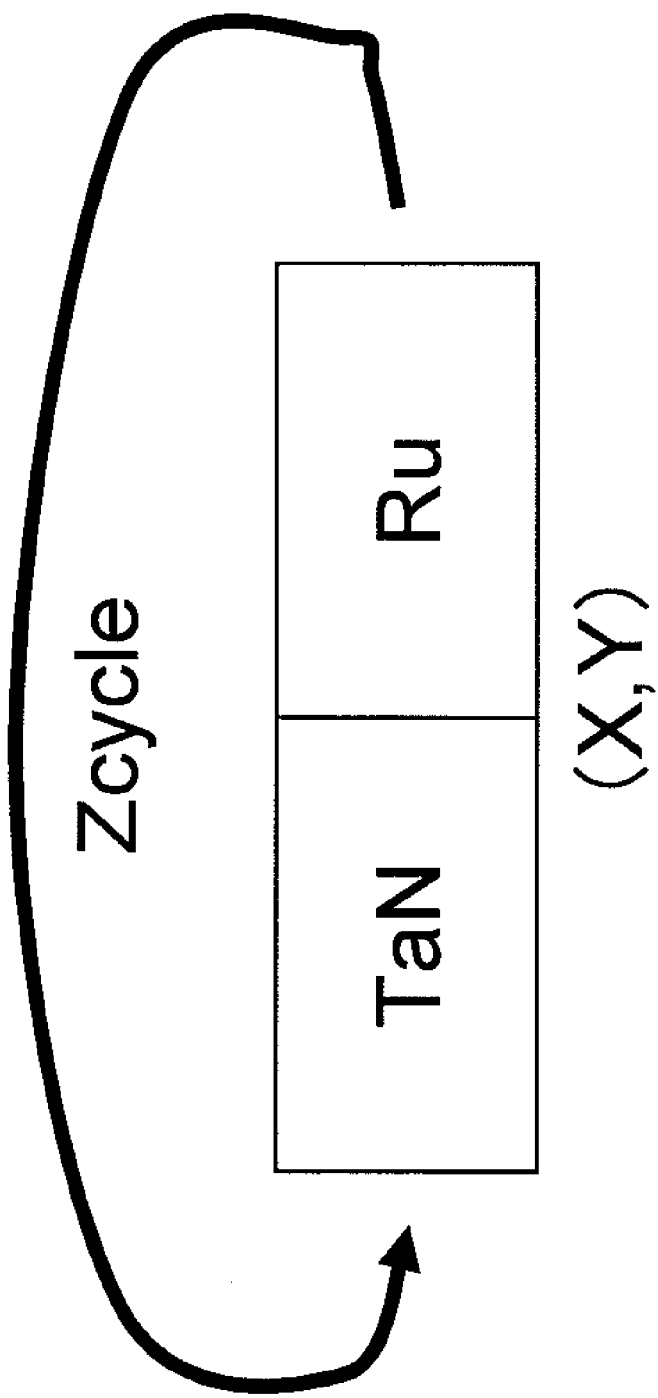
FIG. 2 is a schematic drawing showing a process of forming a metal liner film for Cu wiring used in an embodiment of the present invention.

According to the process proposed by the present invention, a laminated structure consisting of metal layers 113, 114, 115 shown in FIG. 1 can be formed as an optimal liner metal film structure for Cu wiring, by selecting an optimal material that allows for breakdown of Ta and Ru materials and deposition of both atomic layers, as well as use of the same film forming temperature with both materials, and also by setting proper values for the atomic layer deposition cycles X and Y and number of repetitions Z of the cycles, because this enables control of the film composition and film itself at the atomic layer level.

The detailed explanation of favorable embodiments presented above further should reveal specific methods for implementing the present invention.

Figure 3:
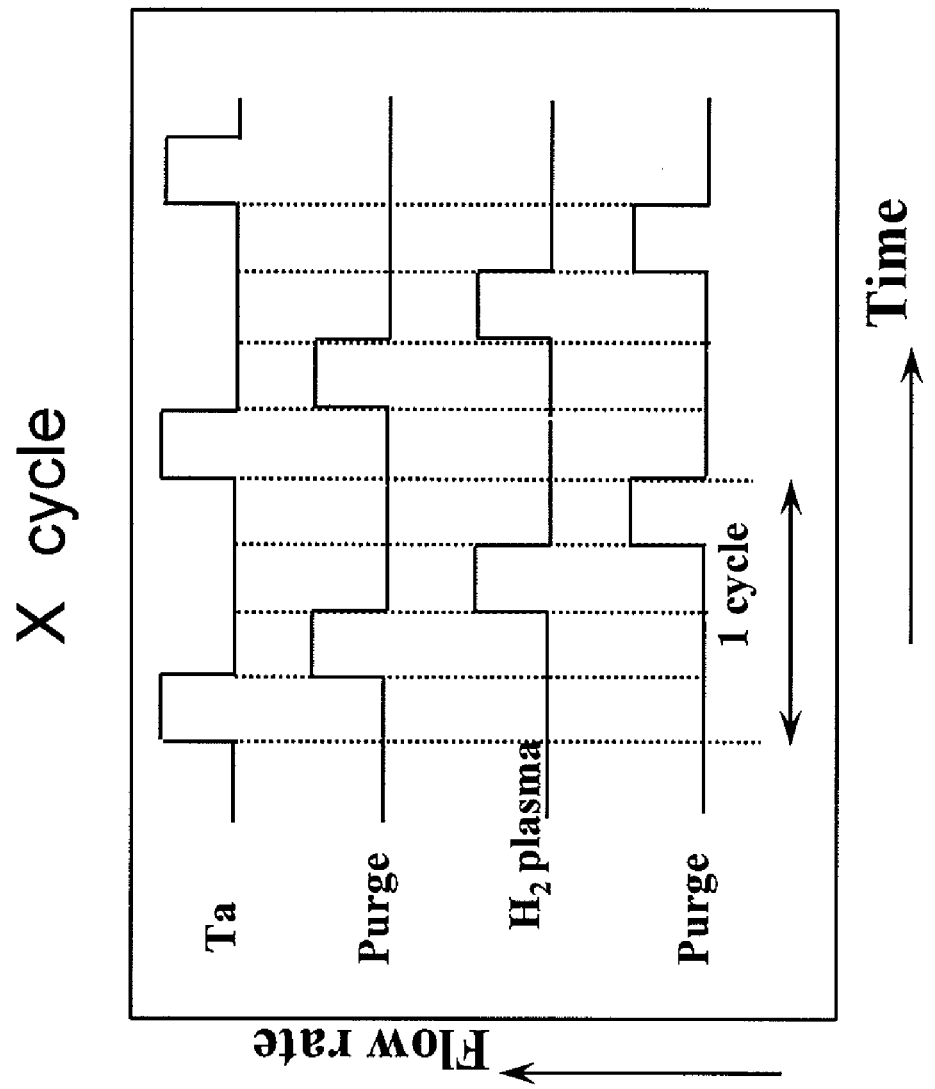
FIG. 3 is a schematic drawing showing a process of forming a TaN or TaNC film used in an embodiment of the present invention.
Figure 5:
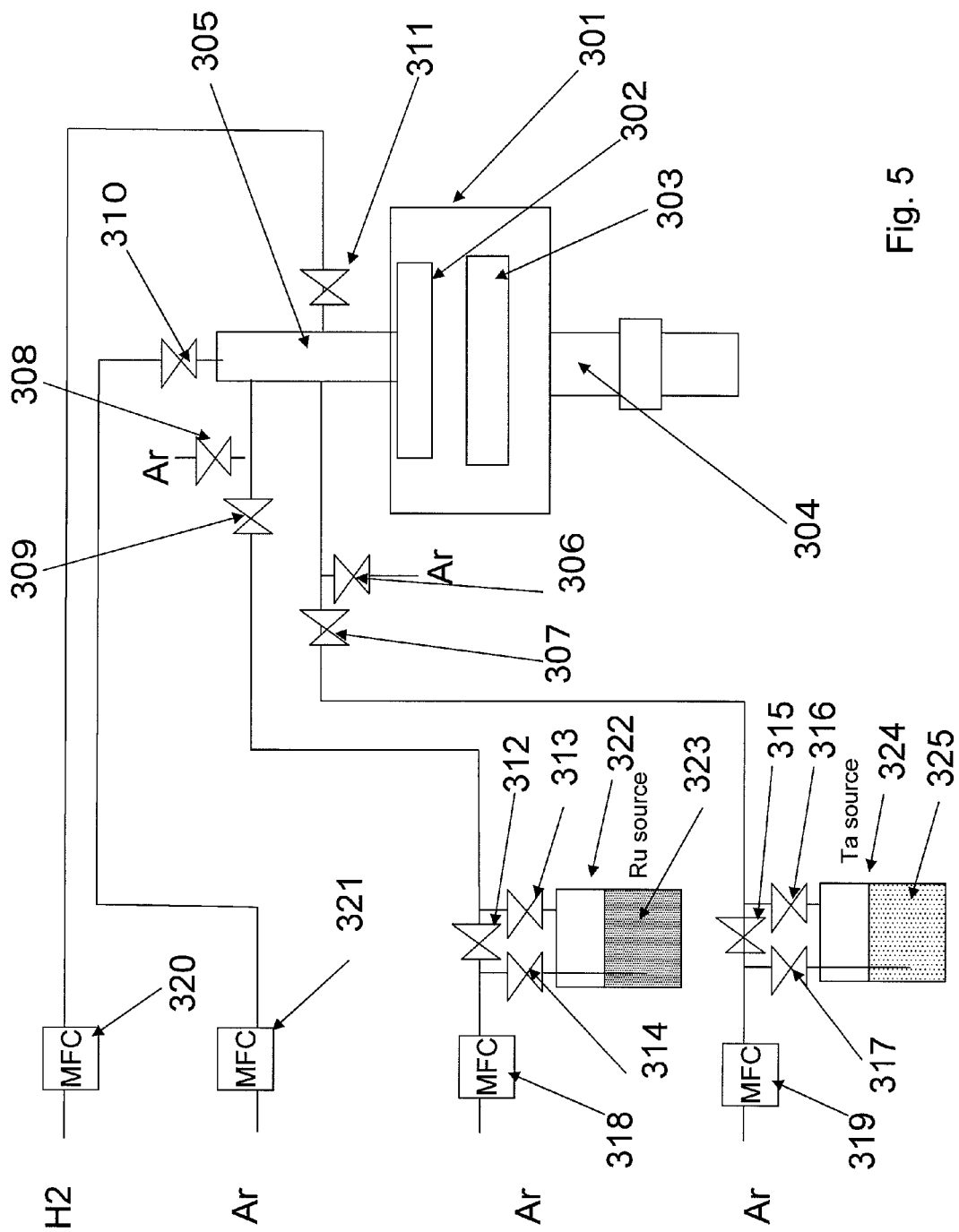
FIG. 5 is an outline drawing showing an example of an atomic layer deposition apparatus that can be used to implement the present invention.

The laminated film consisting of metal layers 113, 114, 115 that constitute the Cu wiring liner metal shown in FIG. 1 can be formed successively using the atomic layer deposition apparatus shown in FIG. 5. FIGS. 2 through 4 show the procedure to implement this process. Specifically, a three-layer film can be formed by repeating (X1, Y1) Z1 times, repeating (X2, Y2) Z2 times, and then repeating (X3, Y3) Z3 times. As for the structure shown in FIG. 1, the best formation ranges, and structure, of a film are (X1,Y1)=(1, 2 to 10), (X2, Y2)=(1, 0), and (X3, Y3)=(0, 1). Under other embodiments, X1=1 to 2, Y1=2 to 12 (e.g., 5 to 10) (X1<Y1), X2=1 to 3, Y2=0 or 1 (X2>Y2), X3=0 or 1, and X3=1 to 3 (X3<Y3) may be used. Proper numbers of repetitions Z1, Z2, Z3 are approximately. 5 to 10 (or 4 to 20 in other embodiment), approximately. 30 to 60 (or 20 to 80 in other embodiment), and approximately. 50 to 100 (or 30 to 200 in other embodiment), respectively. In an embodiment, the relationship of Z1<Z2<Z3 holds water. The thicknesses of metal layers 113, 114, 115 are approximately. 0.5 to 1.0 nm, 1.5 to 10 nm, and 1 to 2 nm, respectively, in an embodiment. This is because, since the purpose of each layer is different, the film thickness needed to demonstrate the required performance of each film can be achieved by changing the relevant cycle settings. In other words, adhesion property with respect to the bottom Cu wiring layer and inter-layer insulation layer, as well as low resistivity, are important for the metal layer denoted by 114, while copper diffusion prevention and low resistivity are important for the metal layer denoted by 115. Adhesion property with respect to the top Cu wiring layer is an important characteristic of the metal layer denoted by 116.

In an embodiment conforming to FIG. 3, the Ta introduction period is 0.5 to 2 seconds, purge period is 1 to 5 seconds, $H_2$ plasma period is 1 to 10 seconds, and purge period is 1 to 3 seconds, in each of X cycles. In an embodiment conforming to FIG. 4, the Ru introduction period is 0.5 to 10 seconds, purge period is 1 to 5 seconds, $H_2$ plasma period is 1 to 10 seconds, and purge period is 1 to 3 seconds, in each of Y cycles.

An example of the structure of the atomic layer deposition apparatus whose sectional schematic view is shown in FIG. 5 is explained. A showerhead 302 and substrate heating stage 303 are installed in a reactor 301, and an exhaust for evacuation 304 is connected to the reactor. A material-gas mixing introduction port 305 is also connected to the showerhead 302. Connected to this material-gas mixing introduction port 305 are material gas introduction pipes. Hydrogen gas is introduced from a flow rate controller 320 via an introduction valve 311. Ru material is introduced via another introduction valve 309. With Ru material, argon gas, which is a carrier gas, is introduced into Ru material 323 inside a material bottle 322 via a valve 314 from a flow rate controller 318. The bottle 322 remains heated to obtain the necessary vapor pressure. Due to argon carrier, vapor of Ru material 323 is introduced from the valve 309 via another valve 313. Ta material is introduced via a introduction valve 307. With Ta material, argon gas, which is a carrier gas, is introduced into Ta material 325 inside a material bottle 324 via a valve 317 from a flow rate controller 319. The bottle 324 remains heated to obtain the necessary vapor pressure. Due to argon carrier, vapor of Ta material 325 is introduced from the valve 307 via another valve 316.

The sequence shown in FIGS. 2 through 4 can be implemented using the function of the atomic layer deposition apparatus illustrated in FIG. 5.

An embodiment of the present invention is characterized in that the steps involving Ta material vapor, hydrogen plasma, Ru material vapor and hydrogen plasma are combined, as shown in FIGS. 2 through 4, to form a metal liner containing Ta and Ru.

Other embodiment of the present invention is characterized in that the multiple steps shown in FIGS. 2 through 4 are repeated successively. Specifically, a metal layer is formed successively by repeating the process consisting of (X1, Y1) Z1 times, and the process consisting of (X2, Y2) Z2 times.

In other embodiment of the present invention, X may preferably be 1 or 2, while Y1 may be in a range of 1 to 10, to cause both Ta and Ru atoms to exist at the interface with the bottom Cu wiring layer, which is the purpose of the present invention, because the thickness of formed film is normally approximately. 0.5 Å per cycle in the Ta atomic layer deposition process or approximately. 0.2 Å per cycle in the Ru atomic layer deposition process. In other words, repeating the cycles further with the aim of forming an atomic layer comprised of a mixture of Ta and Ru atoms is effectively the same as forming a single atomic layer, and the purpose of ensuring adhesion property with a mixture of Ta and Ru atoms cannot be achieved. Also, supply of Ta material vapor alone, and supply of hydrogen plasma, are repeated to form a TaN layer or TaNC layer that can be used as an excellent Cu diffusion barrier layer. In this case, the sequence where Y2 is 0 can be implemented. To improve the adhesion property with respect to the top Cu wiring layer, forming a Ru layer on top is desired. In this case, X3 is set to 0. Desired thicknesses of respective layers can be achieved by setting Z1, Z2 and Z3 to desired values.

In other embodiment of the present invention, the X1/Y1 ratio is kept smaller than the X2/Y2 ratio. This is partly because a composition containing more Ta atoms than Ru atoms provides greater Cu diffusion barrier property, and partly because a film with a higher Ru content is preferable in terms of adhesion property with the bottom Cu wiring layer.

In other embodiment of the present invention, X/Y of the topmost-layer film is set greater than X/Y of the bottom-layer film. This is because the top layer requires good adhesion property with Cu wiring and thus forming a film with a higher Ru content, or preferably a Ru film, is desired, while the bottom layer requires Cu diffusion barrier property and when the adhesion property with respect to the bottom Cu wiring layer and inter-layer insulation film is considered along with Cu diffusion barrier property, the Ta content needs to be high and therefore the X/Y ratio is preferably higher.

In other embodiment of the present invention, Ta material consists of at least one type of material selected from TAIMATA: (Tertiaryamylimidotris(dimethylamido)tantalum, TBTDET: (Ta(N-i-$C_4H_9$)[N($C_2H_5$)$_2$]$_3$ and PDMAT: (Ta [N($CH_3$)$_2$]$_5$), while Ru material has two β diketone groups, thereby enabling a film forming process using hydrogen plasma and facilitating a successive control of composition and film thickness, thereby achieving a Cu wiring liner metal structure conforming to the present invention. Here, the Ta material becomes a metal film containing Ta, N an C as a result of atomic layer deposition via reaction with hydrogen plasma. On the other hand, the Ru material becomes a metal film containing Ru, C and O as a result of atomic layer deposition via reaction with hydrogen plasma. In an embodiment, however, C and O contained in the Ru film are trace amounts of 1% or less, and thus a film with a Ru content of 99% or more can be formed. With Ta material, on the other hand, the N/Ta and C/Ta ratios vary depending on the hydrogen plasma conditions. In an embodiment, they change over a range of 0.1 to 0.8. If relatively large amounts of nitrogen and carbon atoms are contained, the resulting film is described as "TaNC film." If the content of N or C is sufficiently small, the resulting film is described as "TaC" or "TaN," respectively.

Accordingly, a metal film comprised of a mixture of Ta, Ru, N and C can be formed by using these materials, while a TaN, TaC, TaNC or Ru film can also be formed. Also, laminated structures where the compositions of these films are controlled can be formed.

In other embodiment of the present invention, the Cu wiring liner film proposed by the present invention can be used as a metal film on top of a Cu or other layer, a metal silicide film formed in areas contacting the substrate, a $SiO_2$ film used as an inter-layer insulation film, or a SiOC or other film comprising an inter-layer insulation film of low dielectric constant. These films may be formed on top of an inter-layer insulation film where the bottom of via holes is Cu, as in the case of the dual damascene structure shown in FIG. 1, or when electrical contact is made on a nickel silicide film formed on a silicon diffusion layer, a Cu liner metal conforming to the present invention can also be formed on top of the nickel silicide film.

An example of the present invention is explained below in details. It should be noted, however, that the present invention is not at all limited to this example.

EXAMPLE

An example of forming a metal liner film for Cu wiring conforming to the present invention based on the sequence shown in FIGS. 2 through 4, structure shown in FIG. 1 and apparatus shown in FIG. 5 is explained by citing the actual process conditions.

Figure 6:
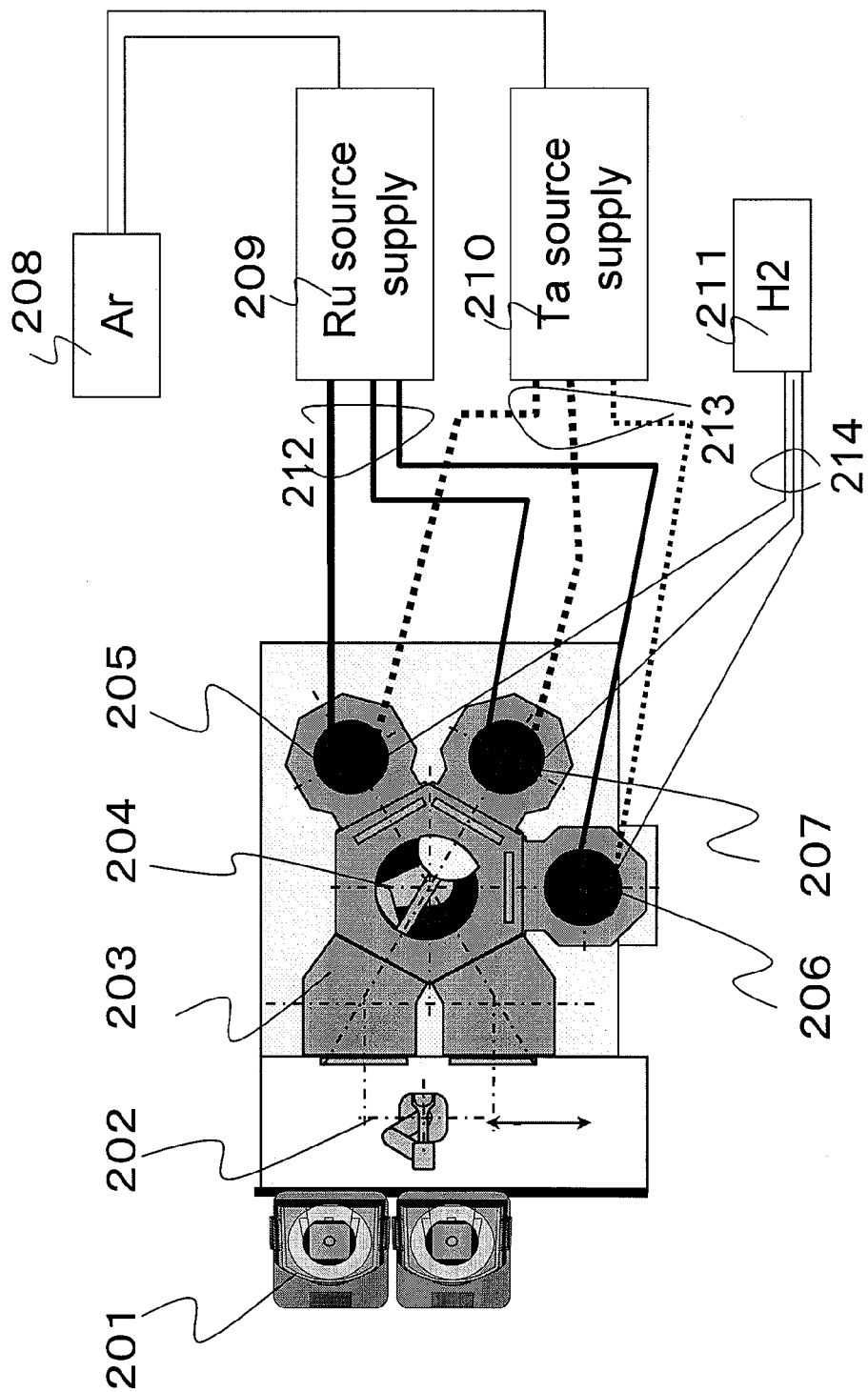
FIG. 6 is a schematic drawing of the structure of a cluster apparatus consisting of multiple sets of an atomic layer deposition apparatus for forming metal liner film for Cu wiring that can be used in an embodiment of the present invention.

A substrate on which the dual damascene structure shown in FIG. 1(a) has been formed is introduced to the apparatus for forming Cu wiring liner metal film shown in FIG. 6, where said apparatus consists of three units of the atomic layer deposition apparatus shown in FIG. 5 each connected to a vacuum transfer chamber. The apparatus shown in FIG. 6 has a cassette loader 201, atmospheric transfer robot 202, load lock chamber 203, vacuum transfer chamber 204, and atomic layer deposition apparatuses 205, 206, 207 per FIG. 5. The atomic layer deposition apparatuses 205, 206, 207 all have the same gas lines, and are equipped with a Ru material supply part 209, Ta material supply part 210, $H_2$ gas supply part 211, and argon gas supply part 208 for transporting Ru and Ta materials. The reactors 205, 206, 207 are connected to heated gas lines 212, 213, as well as a hydrogen gas line 214. After being introduced by the cassette loader of the apparatus shown in FIG. 6, the substrate travels through the atmospheric transfer robot 202, load lock chamber 203 and vacuum transfer chamber 204, to be eventually introduced to the atomic layer deposition apparatuses 205, 206, 207.

The transferred substrate, having the structure shown in FIG. 1(a), is processed by each atomic layer deposition apparatus for 1 minute at a temperature of 300° C., vacuum of 1,000 Pa, hydrogen flow rate of 500 sccm, and Ar gas flow rate of 1,200 sccm. The purpose of using these conditions is to create a reducing atmosphere in which to reduce the oxidized layer at the surface of bottom Cu wiring layer exposed at the bottom of via holes 108, and thereby lower the via resistivity. After this process, the metal layer 113 shown in FIG. 1(b) is formed using the process illustrated in FIG. 7. The forming conditions for this metal layer 113 are X=1, Y=2 and Z=10 in FIG. 7. Table 1 shows the process conditions for the basic atomic layer deposition cycle using Ta material, as well as the process conditions for the atomic layer deposition cycle using Ru material. Here, Taimata is used as Ta material, while Ru material consists of three hydrogen groups where X1 bonds with carbon and three methyl groups where X2 bonds with carbon according to chemical formula (1). The material bottles 322, 324 are maintained at 120 and 110° C., respective, to ensure sufficient material vapor pressures required in the processes. The process conditions are shown in Table 1.

flow rate controller 320. Although not illustrated in FIG. 5, at this time the high-frequency showerhead 302 is excited to apply high-frequency power (0.1 to 30 MHz; 100 to 1,000 W) between the showerhead and the heater stage 303 on which the substrate is placed, to generate hydrogen plasma through matching process. At this time, the process pressure is set in a

TABLE 1

| FIG. | | | step | | | | | | | |
|---|---|---|---|---|---|---|---|---|---|---|
| 5 No | Type | Flow gas | Ta pulse | Ta purge | H2 pulse | H2 purge | Ru pulse | Pu Purge | H2 pulse | H2 purge |
| 306 | Valve | Ar Flow | OFF | ON (400) | ON (400) | ON (400) | ON (400) | ON (400) | ON (400) | ON (400) |
| 307 | Valve | Ta material | ON (400) | OFF | OFF | OFF | OFF | OFF | OFF | OFF |
| 308 | Valve | Ar Flow | ON (400) | ON (400) | ON (400) | ON (400) | OFF | ON (400) | ON (400) | ON (400) |
| 309 | Valve | Ru material | OFF | OFF | OFF | OFF | ON (400) | OFF | OFF | OFF |
| 310 | Valve | Ar purge flow rate | ON (400) | ON (400) | ON (400) | ON (400) | ON (400) | ON (400) | ON (400) | ON (400) |
| 311 | Valve | $H_2$ flow rate | OFF | OFF | ON (RF) | OFF | OFF | OFF | ON (RF) | OFF |
| 312 | Valve | Ru material bypass | OFF | OFF | OFF | OFF | OFF | OFF | OFF | OFF |
| 313 | Valve | Ru material OUT | ON | ON | ON | ON | ON | ON | ON | ON |
| 314 | Valve | Ru material IN | ON | ON | ON | ON | ON | ON | ON | ON |
| 315 | Valve | Ta material bypass | OFF | OFF | OFF | OFF | OFF | OFF | OFF | OFF |
| 316 | Valve | Ta material OUT | ON | ON | ON | ON | ON | ON | ON | ON |
| 317 | Valve | Ta material IN | ON | ON | ON | ON | ON | ON | ON | ON |
| 318 | MFC | Ar Flow | 0 sccm | 0 sccm | 0 sccm | 0 sccm | 400 sccm | 0 sccm | 0 sccm | 0 sccm |
| 319 | MFC | Ar Flow | 400 sccm | 0 sccm | 0 sccm | 0 sccm | 0 sccm | 0 sccm | 0 sccm | 0 sccm |
| 320 | MFC | H2 Flow | 0 sccm | 0 sccm | 500 sccm | 0 sccm | 0 sccm | 0 sccm | 500 sccm | 0 sccm |
| 321 | MFC | Ar Flow | 400 sccm | 400 sccm | 400 sccm | 400 sccm | 400 sccm | 400 sccm | 400 sccm | 400 sccm |

As shown in Table 1, the substrate is transferred to the atomic layer deposition apparatus 301 and placed on the substrate heating stage 303, after which the substrate is normally maintained in this condition for approximately. 50 seconds to achieve a uniform temperature. The substrate heating stage is set to 300° C. (or 200 to 400° C. in other embodiment), while the actual wafer temperature is approximately. 290° C. Next, according to the procedure shown in Table 1, argon gas (or other inert gas; the same applies hereinafter) is supplied at 400 sccm (or 200 to 1,000 sccm in other embodiment) from 308 and 310, respectively, where 400 sccm of argon gas is supplied by the argon flow rate controller 319 through the valve denoted by 317, after which it is mixed with the vapor of Ta material 325 and the mixture is sent through the valve denoted by 316, and then supplied from the valve denoted by 307. The supply time of Ta material can be normally set in a range of 0.5 to 2 seconds. While Ta material is supplied, the vacuum pressure may preferably be controlled at approximately. 300 to 500 Pa. Here, a stable flow rate control can be implemented by installing an orifice at the valve denoted by 307 and controlling the argon pressure using the orifice. Next in the Ta purge step, the Ta supply valve 307 is closed while at the same time the setting of the argon flow rate controller 319 is reduced to 0, as shown in Table 1. Simultaneously as this happens, 400 sccm (or 200 to 1,000 sccm in other embodiment) of argon gas is supplied from the argon purge valve for Ta supply line 306. Normally this purge is performed for approximately. 1 to 5 seconds. During the purge, the process pressure may preferably be kept to 50 Pa or less so that the residual Ta material can be exhausted at the lowest vacuum level possible.

Next, the hydrogen pulse step is performed.

Here, the hydrogen gas supply valve 311 is opened to supply hydrogen at a flow rate of 500 sccm (or 200 to 1,000 sccm in other embodiment) by means of the hydrogen-gas range of 200 to 500 Pa. The process time is set in a range of approximately. 1 to 10 seconds. After this step, the $H_2$ purge step is performed. Here, the hydrogen introduction valve 311 is closed to perform evacuation for approximately. 1 second.

Next, the Ru atomic layer deposition process is explained using Table 1. Essentially, a Ru atomic layer can be formed using a procedure similar to the one for atomic layer deposition using Ta material.

According to the procedure shown in Table 1, argon gas is supplied at 400 sccm (or 200 to 1,000 sccm in other embodiment) from 306 and 310, respectively, where 400 sccm of argon gas is supplied by the argon flow rate controller 318 through the valve denoted by 314, after which it is mixed with the vapor of Ru material 323 and the mixture is sent through the valve denoted by 313, and then supplied from the valve denoted by 309. The supply time of Ru material can be normally set in a range of 0.5 to 10 seconds. This supply time can be increased if the vapor pressure of Ru material is low, or decreased if the vapor pressure is high. With the material used in this example, favorable atomic layer deposition could be achieved by supplying the material for 5 seconds at 110° C. While Ru material is supplied, the vacuum pressure may preferably be controlled at approximately. 300 to 500 Pa. Here, a stable flow rate control can be implemented by installing an orifice at the valve denoted by 309 and controlling the argon pressure using the orifice.

Next in the Ru purge step, the Ru supply valve 309 is closed while at the same time the setting of the argon flow rate controller 318 is reduced to 0, as shown in Table 1. Simultaneously as this happens, 400 sccm (or 200 to 1,000 sccm in other embodiment) of argon gas is supplied from the argon purge valve for Ru supply line 308. Normally this purge is performed for approximately. 1 to 5 seconds. During the purge, the process pressure may preferably be kept to 50 Pa or less so that the residual Ru material can be exhausted at the lowest vacuum level possible. Next, the hydrogen pulse step is performed. Here, the hydrogen gas supply valve 311 is opened to supply hydrogen at a flow rate of 500 sccm (or 200 to 1,000 sccm in other embodiment) by means of the hydrogen-gas flow rate controller 320. Although not illustrated in FIG. 5, at this time the high-frequency showerhead 302 is excited to apply high-frequency power between the showerhead and the heater stage 303 on which the substrate is placed, to generate hydrogen plasma through matching process. At this time, the process pressure is set in a range of 200 to 500 Pa. The process time is set in a range of approximately. 1 to 10 seconds. After this step, the $H_2$ purge step is performed. Here, the hydrogen introduction valve 311 is closed to perform evacuation for approximately. 1 second. A TaRu mixed metal layer 113 has now been formed.

The above explained the Ta atomic layer deposition process and Ru atomic layer deposition process, respectively. Although the two processes are alternated when X= and Y=1, if X=1 and Y=2 the Ta cycle is performed once, after which the Ru cycle is performed twice, and then the Ta cycle and Ru cycle are performed once and twice, respectively.

Furthermore, a similar procedure was used to form a TaNC film as the metal film 114 successively, without losing the vacuum, by setting X to 1, Y to 0 and Z to 40 (this is the same as setting X to 40 and Z to 1).

Furthermore, a similar procedure was used to form a Ru film as the metal film 115 successively, without losing the vacuum, by setting X to 0, Y to 1 and Z to 50 (this is the same as setting Y to 50 and Z to 1). After this Cu wiring liner metal was formed, the procedure in FIG. 1 was followed to form a Cu wiring 118 for the top layer. Next, a wiring structure for the top layer was created. In essence, this process created a structure of TaRu mixed metal layer (also referred to as "alloy layer")/TaNC layer/Ru layer (structure c). On the other hand, two-layer wiring via chains 400 shown in FIG. 7 were formed by implementing this Cu wiring liner metal as a TaRu alloy layer (structure b) (first layer in structure c only) and as TaNC and Ru layers (structure a) (second and third layers of structure c only).

In these two-layer wiring structures, the bottom Cu wiring layer 403 used a PVD-Ta/TaN film 401 as a Cu liner to form on top of the bottom Cu wiring layer a Cu diffusion barrier film 402 comprised of SiC. Furthermore, via holes 405 and Cu wiring 406 were formed by the dual damascene method. Here, Cu liners 404 of structures (a), (b) and (c) were formed before the top Cu wiring layer 406 was formed, as described above. Also, a Cu diffusion barrier 407 comprised of SiC was formed on the top Cu wiring layer 406. These samples were kept at a high temperature of 150° C. to evaluate generation of stress-induced voids. Since generation of voids results in a rise in via resistivity, vulnerability to void generation can be compared by measuring the change in via chain resistance.

Figure 7:
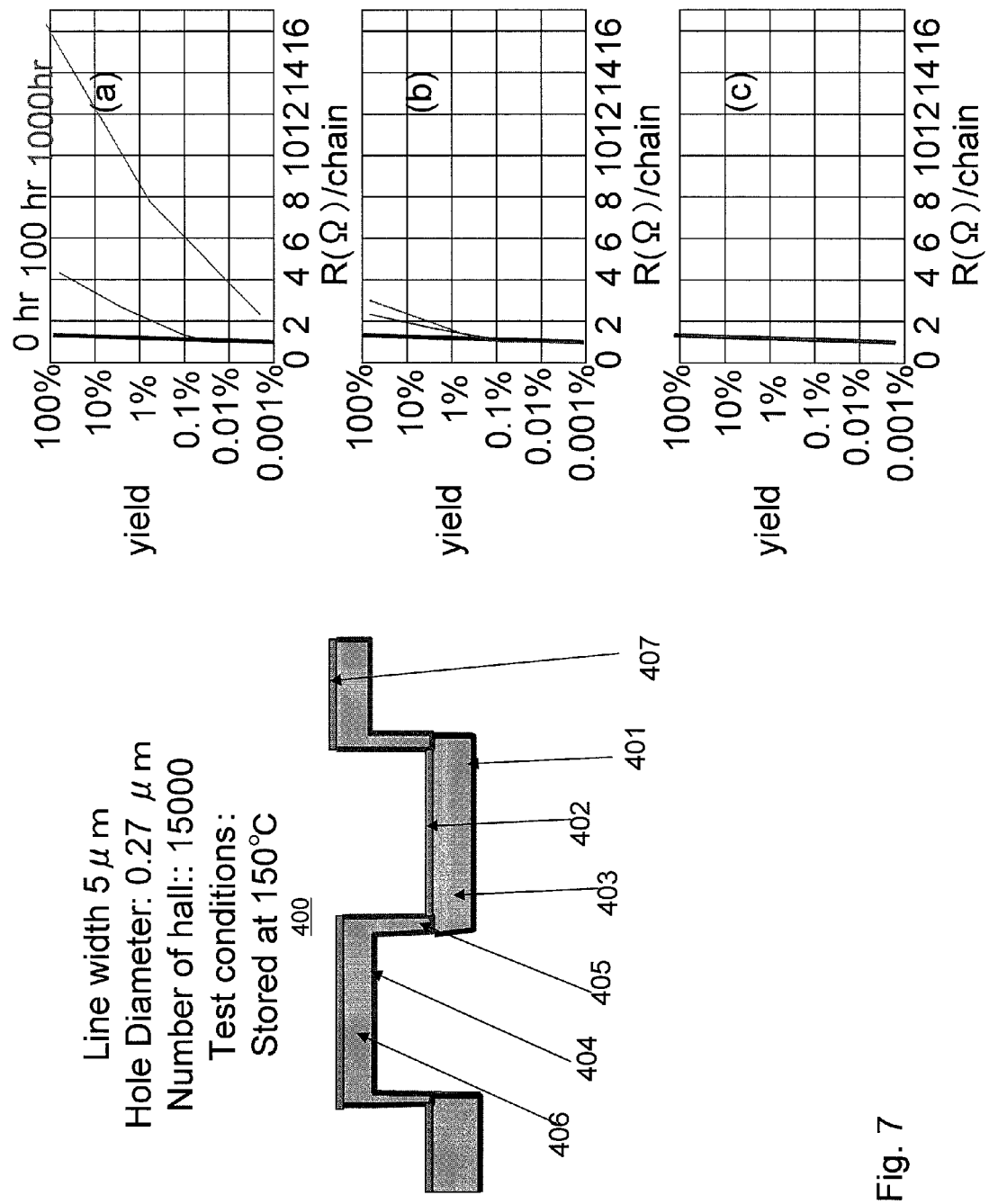
FIG. 7 is a drawing showing the reliability evaluation results on generation of stress-induced voids (structures (a), (b), (C)).

In FIG. 7, structure (c) was found most stable, with no resistance change occurring after 1,000 hours. On the other hand, the resistance of structure (a) changed significantly due to poor adhesion property at the interface of TaNC and Cu. Although the void generation in the structure (b) improved significantly, the adhesion property of TaRu alloy and Cu will likely present a problem.

Figure 8:
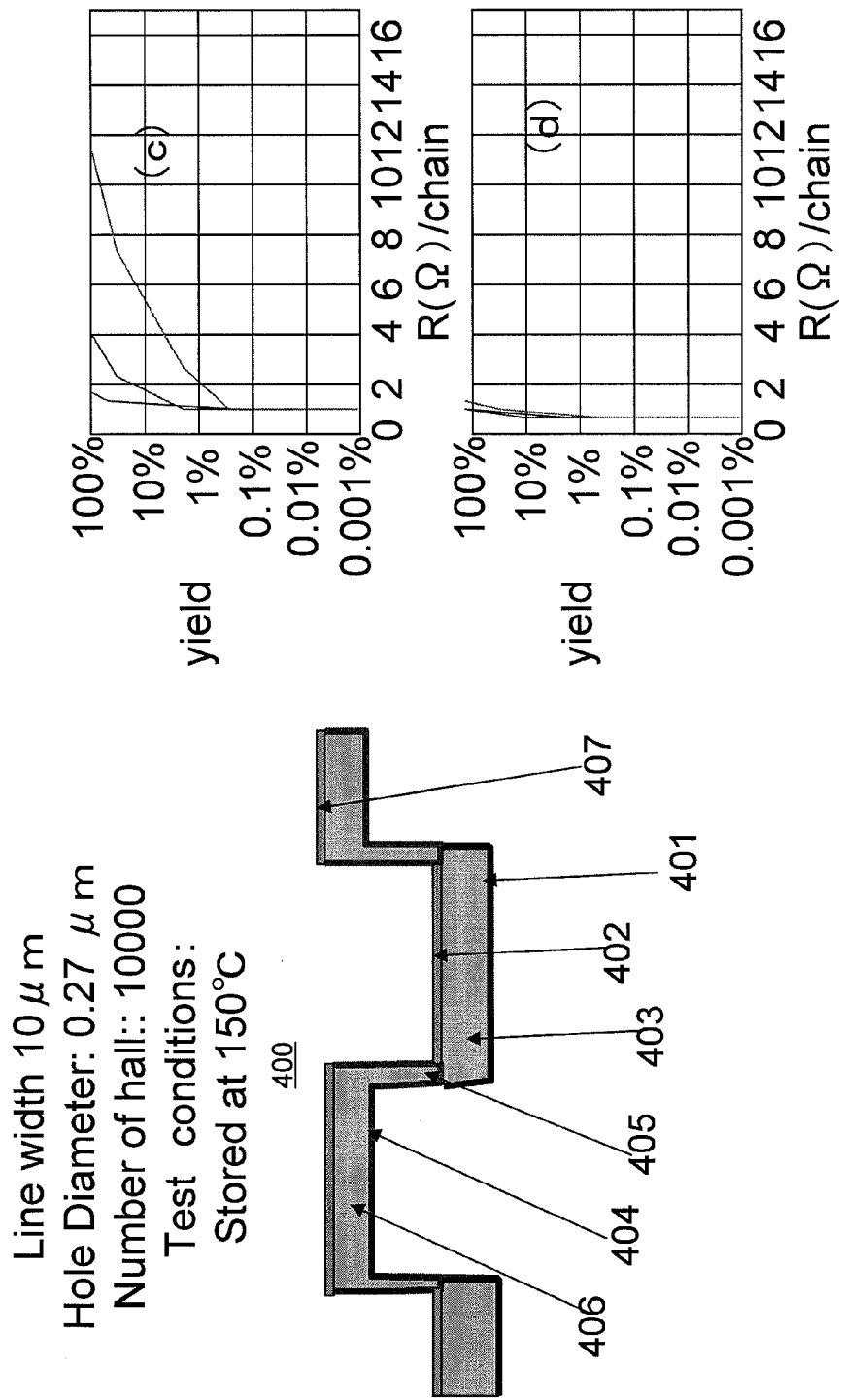
FIG. 8 is a drawing showing the reliability evaluation results on generation of stress-induced voids (structures (c), (d)).

With structure (c), the adhesion property of TaRu alloy layer and Cu wiring improved significantly compared to the adhesion property of TaNC layer and Cu wiring, but the achieved level was still lower than the adhesion property of Cu wiring and Ru layer. Accordingly, a TaRu mixed metal layer/TaNC layer/Ru layer structure (structure d) was formed by setting X and Y to 1 and 5, respectively, in the TaRu alloy layer forming process (Z was set to 10; Z may preferably be selected from 10 to 100). FIG. 8 compares the changes in resistivity caused by thermal stress. Here, the wiring width was increased further from 5 μm to 10 μm to create a more stringent test condition. As a result, it was found that increasing the Ru content in the TaRu mixed metal layer would reduce the change in resistivity. Accordingly, it is effective to use a structure based on optimized Ta and Ru contents at the interface between the bottom Cu wiring layer and the metal liner 404 that has been formed at the interface of the bottom Cu wiring layer 403 and top Cu wiring layer 406.

Figure 9:
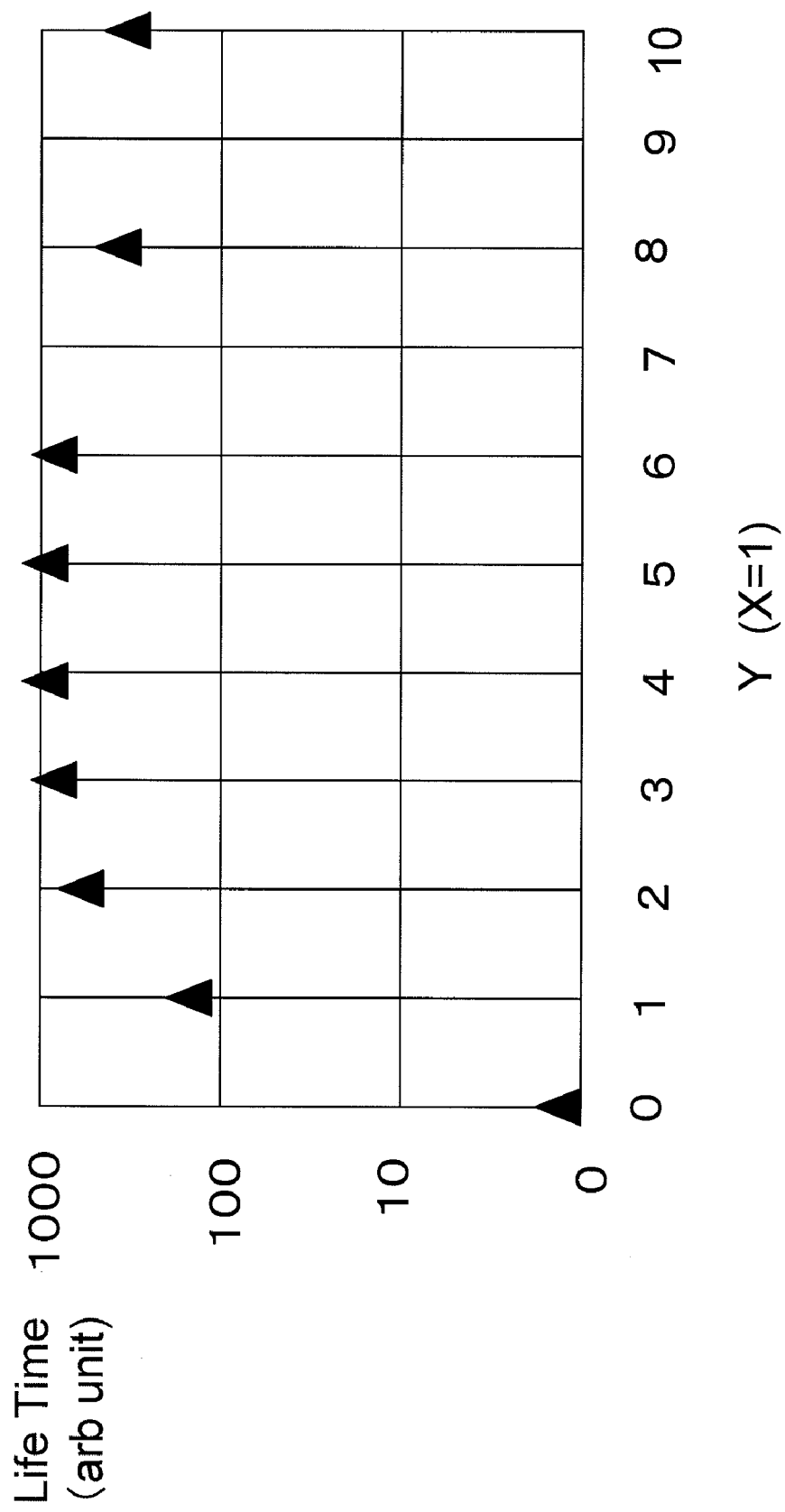
FIG. 9 is a drawing showing the dependence of life in terms of stress-induced voids on pulse count Y in Ru atomic layer deposition.

FIG. 9 shows the evaluation results obtained by fixing X at 1 and varying Y from 0 to 10, or specifically to 0, 1, 2, 3, 5, and 10. The times at which the average resistivity increased by 50% or more were plotted in arbitrary units. When Y was 0, voids generated in the initial stage in most cases. When Y was 1, the life improved significantly, and the life became even longer when Y was 2. When Y was increased further from 2, however, the effect gradually saturated. Although sufficient benefits can be achieved at Y=1, it is clear that setting Y to 2 or greater is the best when forming a TaRu alloy layer at the interface of bottom Cu wiring layer and Cu barrier film. The life decreased slightly when Y was 8 or 10. The cause is not clear, although the drop in adhesion property with respect to the inter-layer film may have something to do with the negative outcome. It should be noted, however, that the life was still equivalent to or better than when Y was 1. Accordingly, Y can be set in a range of 1 to 10 when X is 1, and preferably Y may be adjusted to a range of 2 to 6 for better results.

As shown in the above example, a laminated structure offering excellent stability and adhesion property can be formed by means of forming a multi-layer liner metal film structure for Cu wiring, wherein said metal liner consists of a metal layer containing Ta and Ru whose contents have been optimized, a TaNC layer that functions as a Cu diffusion barrier, and Ru layer that serves as an excellent Cu adhesion layer.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method of forming a Ta—Ru metal liner layer for Cu wiring, comprising:
   (i) conducting atomic deposition of Ta X times, each atomic deposition of Ta being accomplished by a pulse of hydrogen plasma, wherein X is an integer such that a surface of an underlying layer is not covered with Ta particles;
   (ii) after step (i), conducting atomic deposition of Ru Y times, each atomic deposition of Ru being accomplished by a pulse of hydrogen plasma, wherein Y is an integer such that the Ta particles are not covered with Ru particles; and
   (iii) repeating steps (i) and (ii) Z times, thereby forming a Ta—Ru metal liner layer on a Cu wiring substrate.

2. The method according to claim 1, wherein Z is an integer of 5 to 10.

3. The method according to claim 1, wherein the hydrogen plasma in steps (i) and (ii) is generated by applying RF power to a gas containing hydrogen.

4. The method according to claim 1, wherein the Cu wiring substrate on which the Ta—Ru metal liner layer is formed is comprised of a metal film, a metal silicide film, and dielectric film.

5. The method according to claim 1, wherein X is an integer of 1 or 2, and Y is a integer of 1 to 10.

6. The method according to claim 5, wherein X is an integer of 1, and Y is an integer of 2 to 6.

7. The method according to claim 1, further comprising, after step (iii):

(iv) changing X, Y, and Z, and conducting steps (i) to (iii), thereby forming a second metal layer on the Ta—Ru metal liner layer which is a first metal layer.

8. The method according to claim 7, further comprising, after step (iv):

(v) changing X, Y, and Z, and conducting steps (i) to (iii), thereby forming a third metal layer on the second metal liner layer.

9. The method according to claim 8, wherein Y for the second metal layer is zero, and X for the third metal layer is zero.

10. The method according to claim 8, wherein a ratio of X/Y for the second metal layer is greater than a ratio of X/Y for each of the first and third metal layers.

11. The method according to claim 8, wherein a ratio of X/Y for the third metal layer is smaller than a ratio of X/Y for each of the first and second metal layers.

12. The method according to claim 9, where X, Y, and Z for the first metal layer are X1, Y1, and Z1, X, Y, and Z for the second metal layer are X2, Y2, and Z2, X, Y, and Z for the third metal layer are X3, Y3, and Z3, wherein X1=1, Y1=2-10, Z1=5-10, X2=1, Y2=0, Z2=30-60, X3=0, Y3=1, and Z3=50-100.

13. The method according to claim 1, wherein step (i) comprises supplying a precursor vapor containing Ta into a reaction chamber and applying a pulse of hydrogen plasma to the vapor X times.

14. The method according to claim 13, wherein the precursor vapor containing Ta is at least one selected from the group consisting of TAIMATA (Tertiaryamylimidotris-(dimethylamido)tantalum), TBTDET (Ta(N-i-C4H9)[N(C2H5)2]3), and PDMAT (Ta[N(CH3)2]5).

15. The method according to claim 1, wherein step (ii) comprises supplying a precursor vapor containing Ru into a reaction chamber and applying a pulse of hydrogen plasma to the vapor Y times.

16. The method according to claim 15, wherein the precursor vapor containing Ru is β-diketone-coordinated ruthenium compound.

* * * * *